United States Patent
Tak

(10) Patent No.: US 11,233,518 B2
(45) Date of Patent: Jan. 25, 2022

(54) CLOCK RECOVERY CIRCUIT, CLOCK DATA RECOVERY CIRCUIT, AND APPARATUS INCLUDING THE SAME

(71) Applicant: Samsung Electronics Co., Ltd., Suwon-si (KR)

(72) Inventor: Geumyoung Tak, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/015,437

(22) Filed: Sep. 9, 2020

(65) Prior Publication Data
US 2021/0184682 A1 Jun. 17, 2021

(30) Foreign Application Priority Data
Dec. 13, 2019 (KR) .................. 10-2019-0167143

(51) Int. Cl.
| | | |
|---|---|---|
| *H03D 3/24* | (2006.01) | |
| *H03L 7/08* | (2006.01) | |
| *H03L 7/089* | (2006.01) | |
| *H03L 7/087* | (2006.01) | |

(52) U.S. Cl.
CPC .......... *H03L 7/0807* (2013.01); *H03L 7/087* (2013.01); *H03L 7/0891* (2013.01)

(58) Field of Classification Search
CPC ..... H03L 7/0807; H03L 7/0891; H03L 7/087; H03L 7/091

USPC .................. 375/373–376, 355, 326, 327
See application file for complete search history.

(56) References Cited

U.S. PATENT DOCUMENTS

| | | | |
|---|---|---|---|
| 7,801,203 B2 | 9/2010 | Chen et al. | |
| 8,878,792 B2 | 11/2014 | Lim et al. | |
| 9,312,865 B2 | 4/2016 | Song et al. | |
| 9,331,822 B1 | 5/2016 | Chang et al. | |
| 9,361,825 B2 | 6/2016 | Jeong et al. | |
| 9,813,070 B2 | 11/2017 | Kim et al. | |
| 9,973,328 B2 | 5/2018 | Lee et al. | |
| 2007/0058768 A1* | 3/2007 | Werner | H03L 7/091 375/376 |
| 2016/0373244 A1 | 12/2016 | Lin et al. | |
| 2018/0173585 A1 | 6/2018 | Moon et al. | |

\* cited by examiner

*Primary Examiner* — Phuong Phu
(74) *Attorney, Agent, or Firm* — Harness, Dickey & Pierce, PLC

(57) ABSTRACT

A clock recovery circuit a first phase-locked loop (PLL) circuit configured to perform a coarse phase fixing operation on a test data signal by using a first reference clock signal, the test data signal having a prescribed pattern, and a second PLL circuit configured to perform a fine phase fixing operation on the test data signal, subsequently to the coarse phase fixing operation. The second PLL circuit may be configured to perform the fine phase fixing operation on the test data signal by selectively using at least two selection reference clock signals among a plurality of second reference clock signals that are delayed from the first reference clock signal by a unit phase, in a training mode, having a phase difference of N times the unit phase, where N is an integer equal to or greater than 2.

19 Claims, 16 Drawing Sheets

CLOCK RECOVERY CIRCUIT, CLOCK DATA RECOVERY CIRCUIT, AND APPARATUS INCLUDING THE SAME

CROSS-REFERENCE TO RELATED APPLICATION

This application claims priority under 35 U.S.C. § 119 to Korean Patent Application No. 10-2019-0167143, filed on Dec. 13, 2019, in the Korean Intellectual Property Office, the disclosure of which is incorporated herein in its entirety by reference.

BACKGROUND

The inventive concepts relate to recovery of a data signal including an embedded clock signal, and more particularly, to clock recovery circuits, clock data recovery circuits, and/or apparatuses including the same.

In order to transmit data at a high speed, a serial communication method may be used. The serial communication method may be used for various applications such as communications among parts included in a system as well as communications among independent devices through a removable port and movement of data in an integrated circuit.

The clock data recovery circuit for generating a recovery clock signal from serial data by detecting a phase of a clock signal embedded in serial data and generating recovery data from the serial data by using the recovery clock signal may be used in various devices and applications for transmitting and receiving data by the serial communication method.

On the other hand, before the clock data recovery circuit performs a recovery operation on an input data signal, a test data signal having a prescribed pattern for training the clock data recovery circuit may be input to the clock data recovery circuit. The clock data recovery circuit may perform a coarse phase fixing operation by using the test data signal and may subsequently perform a fine phase fixing operation. At this time, due to delay mismatch in a path of a coarse phase fixing operation of the clock data recovery circuit and a skew in accordance with an operation characteristic, a result of the coarse phase fixing operation may deteriorate. Because the clock data recovery circuit performs the fine phase fixing operation without recognizing the deteriorated result of the coarse phase fixing operation, a clock signal or data may not be correctly recovered.

SUMMARY

The inventive concepts relate to clock data recovery, and more particularly, to clock recovery circuits and clock data recovery circuits for correctly recovering a clock signal and data from an input data signal and/or apparatuses including the same.

According to an aspect of the inventive concepts, a clock recovery circuit may include a first phase-locked loop (PLL) circuit configured to perform a coarse phase fixing operation on a test data signal by using a first reference clock signal, the test data signal having a prescribed pattern, and a second PLL circuit configured to perform a fine phase fixing operation on the test data signal, subsequently to the coarse phase fixing operation. The second PLL circuit may be configured to perform the fine phase fixing operation on the test data signal by selectively using at least two selection reference clock signals among a plurality of second reference clock signals that are delayed from the first reference clock signal by a unit phase, in a training mode, having a phase difference of N times the unit phase, where N is an integer equal to or greater than 2.

According to an aspect of the inventive concepts, a clock data recovery circuit may include a clock recovery circuit configured to generate a recovery clock signal from an input data signal, the input data signal including an embedded clock signal, and a data recovery circuit configured to generate a recovery data signal from the input data signal by using the recovery clock signal. The clock recovery circuit may include a phase-locked loop (PLL) circuit and the PLL circuit may be configured to perform a first phase fixing operation on the input data signal by selectively using at least two selection reference clock signals, among a plurality of reference clock signals that are sequentially delayed by a unit phase, having a phase difference of N times the unit phase, wherein N is an integer equal to or greater than 2, in a training mode, and a second phase fixing operation on the input data signal by using the plurality of reference clock signals in a normal mode.

According to an aspect of the inventive concepts, a clock recovery circuit may include a first phase-locked loop (PLL) circuit configured to perform a coarse phase fixing operation on a test data signal having a prescribed pattern by using a first reference clock signal, and a second PLL circuit configured to perform a fine phase fixing operation on the test data signal subsequently to the coarse phase fixing operation. The second PLL circuit may be configured to generate sample signals by using at least two selection reference clock signals, among a plurality of second reference clock signals, predicted that rising edges thereof are synchronized to be close to a rising edge or a falling edge of the test data signal as a result of the coarse phase fixing operation among the plurality of second reference clock signals in a training mode, the plurality of second reference clock signals sequentially delayed from the first reference clock signal by a unit phase, respectively, and a phase control signal for controlling phases of the second reference clock signals by complimentarily using the sample signals.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Hereinafter, some example embodiments of the inventive concepts will be described in detail with reference to the accompanying drawings.

Figure 1:
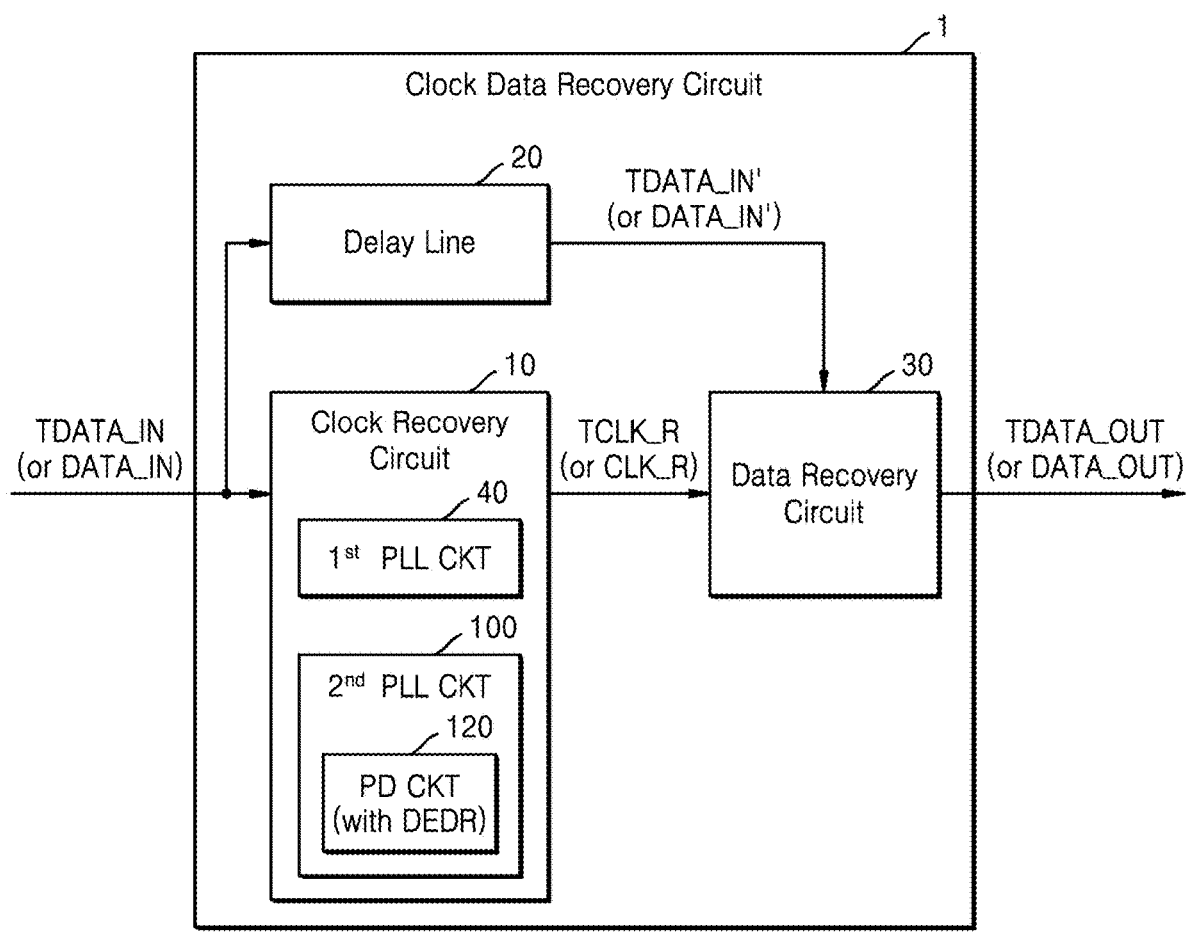
FIG. 1 is a block diagram illustrating a clock data recovery circuit according to an example embodiment of the inventive concepts.

FIG. 1 is a block diagram illustrating a clock data recovery circuit 1 according to an example embodiment of the inventive concepts. In some example embodiments, the clock data recovery circuit 1 of FIG. 1 may be manufactured by semiconductor processes and may be included in a semiconductor device as an integrated circuit. In addition, the clock data recovery circuit 1 may include a receiving circuit (or a receiver, not specifically illustrated in FIG. 1) for receiving data by, for example, a serial communication method. The clock data recovery circuit 1 may receive an input data signal DATA_IN transmitted by a transmission circuit (or a transmitter, not shown) by, for example, the serial communication method, and may generate an output data signal DATA_OUT from the input data signal DATA_IN. On the other hand, the output data signal DATA_OUT may be referred to as a recovery data signal.

Referring to FIG. 1, the clock data recovery circuit 1 may include a clock recovery circuit 10, a delay line 20, and a data recovery circuit 30. The input data signal DATA_IN may include serial bits, that is, a bit sequence. For example, the input data signal DATA_IN may include a packet of sequentially arranged m bits. The clock data recovery circuit 1 may recognize serial data included in the input data signal DATA_IN by sampling (or capturing) the bit sequence included in the input data signal DATA_IN, and may generate the output data signal DATA_OUT including parallel data from the serial data.

In some example embodiments, the input data signal DATA_IN may include a clock signal as well as the serial data. When the data signal including the serial data is received from a transmission circuit through a data line and a clock signal is separately received through a clock line, the receiving circuit may not easily receive the data signal and the clock signal in synchronization with each other due to various factors, and it may limit a data transfer rate. On the other hand, when the transmission circuit has the clock signal included in the data signal and the receiving circuit recognizes the serial data by recovering a normal clock signal included in the data signal, the receiving circuit may sample the bit sequence by recovering the clock signal including a change in data signal so that the data transfer rate may increase.

The clock data recovery circuit 1 may generate a recovery clock signal CLK_R and the output data signal DATA_OUT from the input data signal DATA_IN in a normal mode. The clock data recovery circuit 1 may operate in a training mode by using a test data signal TDATA_IN having a prescribed pattern before operating in the normal mode. The test data signal TDATA_IN may include a test clock signal. A relationship between the test data signal TDATA_IN and the test clock will be described in detail in FIG. 3B. The clock data recovery circuit 1 may fix a phase of a reference clock signal (not shown) used for sampling data in the clock data recovery circuit 1 to be suitable for a phase of the test data signal TDATA_IN by operating in the training mode and tracking the phase of the test data signal TDATA_IN. The clock data recovery circuit 1 may generate a test recovery clock signal TCLK_R and a test output data signal TDATA_OUT from the test data signal TDATA_IN in the training mode. Hereinafter, a description of the clock data recovery circuit 1 in the training mode to which the inventive concepts are applied will be given in detail.

The clock recovery circuit 10 according to an example embodiment may include a first phase locked loop (PLL) circuit 40 and a second PLL circuit 100. The first PLL circuit (or alternatively, auxiliary PLL circuit) 40 may perform a coarse phase fixing operation on the test data signal TDATA_IN by using the reference clock signal. The first PLL circuit 40 may track the phase of the test data signal TDATA_IN by using the reference clock signal, and may perform the coarse phase fixing operation until a phase difference between the phase of the reference clock signal and a phase of the test clock signal is positioned in the previously set dead zone. In some example embodiments, the first PLL circuit 40 may further include a divider (not shown) and may perform the coarse phase fixing operation by using a divided test clock signal or a divided reference clock signal. The first PLL circuit 40 may be inactivated and may be maintained to be in an inactive state in the normal mode until the coarse phase fixing operation in the training mode is completed.

The second PLL circuit 100 may perform a fine phase fixing operation on the test data signal TDATA_IN subsequently to the coarse phase fixing operation by selectively using some of a plurality of reference clock signals. The plurality of reference clock signals may include reference clock signals delayed from a prescribed reference clock signal (for example, a signal generated from an oscillator in the clock data recovery circuit 1) by the unit phase, and phases of the plurality of reference clock signals may be different from each other. The unit phase is a unit corresponding to a unit interval (UI) allotted to transmit one bit data in the input data signal DATA_IN. Hereinafter, it is assumed that the unit phase corresponds to ½ the time of the UI of the input data signal DATA_IN, which is only an example embodiment. The inventive concepts are not limited thereto, and the unit phase and the UI may be set to vary in a range in which the inventive concepts may be applied. Hereinafter, the reference clock signals selectively used in the training mode may be referred to as selection reference clock signals. The selection reference clock signals may be synchronized to be closest or close to a rising or falling edge of the test data signal TDATA_IN as a result of the first PLL circuit 40 performing the coarse phase fixing operation among the plurality of reference clock signals. Then, the selection reference clock signals may include at least one selection reference clock signal for detecting a rising edge of the test data signal TDATA_IN and at least one selection reference clock signal for detecting the falling edge of the test data signal TDATA_IN.

The second PLL circuit 100 may track the phase of the test data signal TDATA_IN by using the selection reference clock signals and may fix the phases of the reference clock signals. The selection reference clock signals may include reference clock signals, among the plurality of reference clock signals, having a phase difference of N times the unit phase, where N is an integer that is equal to or greater than 2. In some example embodiments, reference clock signals selected in accordance with a pattern of the test data signal TDATA_IN, that is, a pattern of the test clock signal, may be different from each other. For example, at least one of the number of reference clock signals selected in accordance with the pattern of the test data signal TDATA_IN and a phase difference among the selected reference clock signals may vary. On the other hand, the second PLL circuit 100 may use all the plurality of reference clock signals in order to track a phase of the normal clock signal included in the input data signal DATA_IN in the normal mode. That is, when the second PLL circuit 100 operates in the training mode, the second PLL circuit 100 may use only some of the plurality of reference clock signals, which are used during an operation of the second PLL circuit 100 in the normal mode.

In an example embodiment, the second PLL circuit 100 may include a phase detection circuit 120 for detecting the edge of the test clock signal in order to track the phase of the test clock signal. For example, the phase detection circuit 120 may be implemented so that a detecting range in which the edge of the test clock signal may be detected in the training mode is greater than a detecting range in which an edge of the normal clock signal may be detected in the normal mode. As will be described later, this is for the second PLL circuit 100 to correctly perform a phase fixing operation considering an initial skew that may be generated in the coarse phase fixing operation of the first PLL circuit 40. For example, when a phase difference between the test clock signal and the reference clock signal deviates from the above-described dead zone due to the initial skew in the first PLL circuit 40, a result of the second PLL circuit 100 performing the phase fixing operation premising that the phase difference is positioned in the dead zone may include an error. Because the error has a negative influence on an operation of the clock data recovery circuit 1 in the normal mode, it may be difficult to correctly perform a recovery operation. In order to solve the problem, in the training mode, the phase detection circuit 120 may detect the edge of the test clock signal in an edge detecting range greater than that in the normal mode. As described above, the phase detection circuit 120 may have a dynamic edge detecting range (DEDR) in accordance with an operation mode.

The phase detection circuit 120 according to an example embodiment may sample the test clock signal by using the selection reference clock signals in the training mode and may detect the edge of the test clock signal by using sample signals. The second PLL circuit 100 may generate a phase control signal for controlling phases of the selection reference clock signals based on the edge detection result. A detailed operation of the phase detection circuit 120 will be described later.

The clock recovery circuit 10 may generate the test recovery clock signal TCLK_R from the test data signal TDATA_IN and may output the test recovery clock signal TCLK_R to the data recovery circuit 30. The delay line 20 may receive the test data signal TDATA_IN, may generate a delayed test data signal TDATA_IN' considering delay caused by the clock recovery circuit 10, and may output the delayed test data signal TDATA_IN' to the data recovery circuit 30. The delay line 20 may include a component obtained by copying the clock recovery circuit 10. Furthermore, in the delay line 20, an amount of delay may be adjusted by controlling a voltage. The data recovery circuit 30 may generate the test output data signal TDATA_OUT by sampling the delayed test data signal TDATA_IN' by using the test recovery clock signal TCLK_R. In some example embodiments, it may be determined whether the test output data signal TDATA_OUT is correctly recovered from at least one of internal processors, controllers, and parts of a device, an integrated circuit, and a chip including the clock data recovery circuit 1.

Subsequent to the training mode, in the normal mode, the clock data recovery circuit 1 may operate. In the normal mode, the second PLL circuit 100 of the clock recovery circuit 10 may directly perform the fine phase fixing operation on the input data signal DATA_IN. The clock recovery circuit 10 may generate the recovery clock signal CLK_R from the input data signal DATA_IN and may output the recovery clock signal CLK_R to the data recovery circuit 30. The delay line 20 may generate the delayed test data signal TDATA_IN' from the input data signal DATA_IN and may output the delayed test data signal TDATA_IN' to the data recovery circuit 30. The data recovery circuit 30 may generate the output data signal DATA_OUT by sampling the delayed test data signal TDATA_IN' by using the recovery clock signal CLK_R. The output data signal DATA_OUT may be provided to internal processors, controllers, parts, and memories of a device, an integrated circuit, and a chip including the clock data recovery circuit 1.

In the training mode, the clock data recovery circuit 1 according to an example embodiment of the inventive concepts may perform the fine phase fixing operation based on the edge detecting range greater than that in the normal mode considering the initial skew that may be generated as a result of performing the coarse phase fixing operation. Therefore, the clock data recovery circuit 1 may correctly recover the test clock signal of the test data signal TDATA_IN and, as a result, may correctly perform the clock data recovery operation from the test data signal TDATA_IN in the normal mode.

Figure 2:
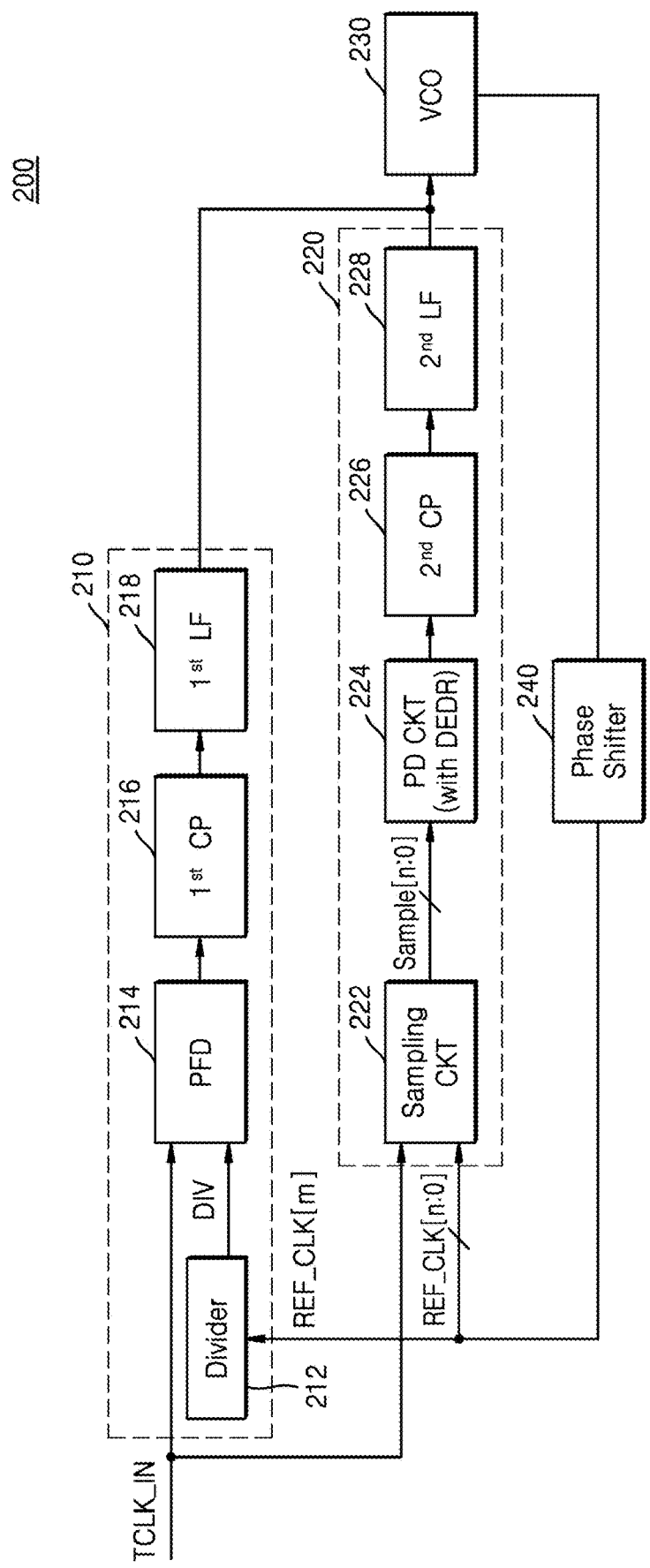
FIG. 2 is a block diagram illustrating a clock recovery circuit according to an example embodiment of the inventive concepts.
Figure 3A:
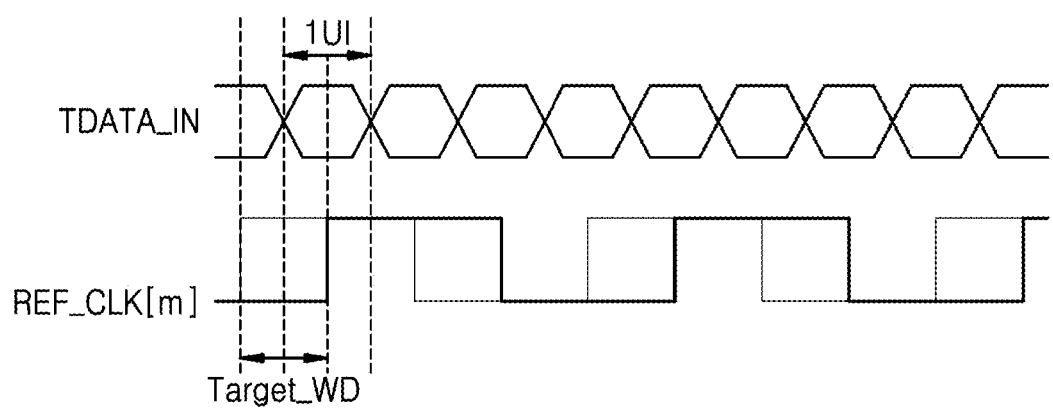
FIG. 3A is a timing diagram illustrating a dead zone of a first phase locked loop (PLL) circuit of FIG. 2
Figure 3B:
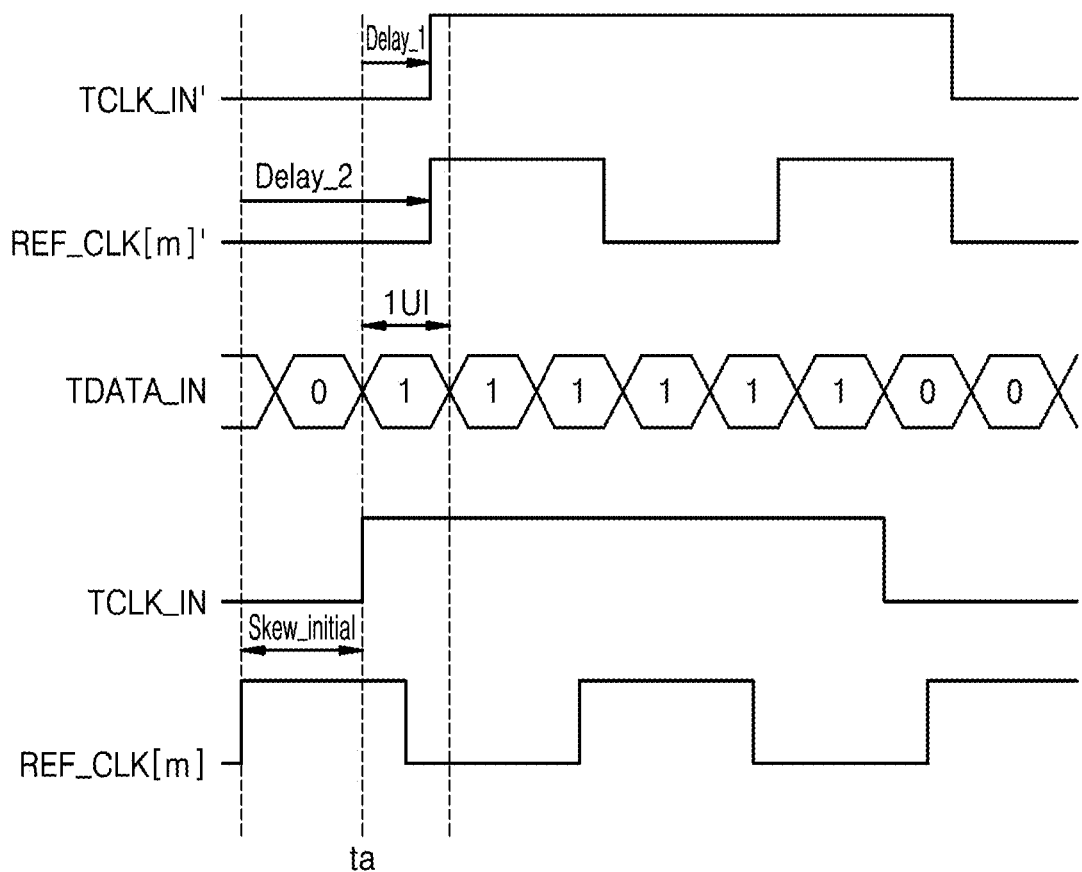
FIG. 3B is a timing diagram illustrating an initial skew that may be generated by the first PLL circuit of FIG. 2.

FIG. 2 is a block diagram illustrating a clock recovery circuit 200 according to an example embodiment of the inventive concepts. FIG. 3A is a timing diagram illustrating the dead zone of a first PLL circuit 210 of FIG. 2 and FIG. 3B is a timing diagram illustrating an initial skew Skew_initial that may be generated by the first PLL circuit 210 of FIG. 2. Hereinafter, the clock recovery circuit 200 for receiving the test clock signal TCLK_IN and recovering the test clock signal TCLK_IN is described and it is premised that the test clock signal TCLK_IN is the same as the test data signal TDATA_IN of FIG. 1.

Referring to FIG. 2, the clock recovery circuit 200 may include the first PLL circuit 210, a second PLL circuit 220, a voltage control oscillator (VOC) 230, and a phase shifter 240. The first PLL circuit 210 may be referred to as an auxiliary PLL circuit. The second PLL circuit 220 may be referred to as a main PLL circuit or a sub-sampling PLL circuit.

The first PLL circuit 210 may include a divider 212, a phase frequency detector (PFD) 214, a first charge pump circuit 216, and a first loop filter (LF) 218. The divider 212 may receive a first reference clock signal REF_CLK[m] generated by the VCO 230 and phase adjusted by the phase shifter 240 and may generate a divided reference clock signal DIV. In some example embodiments, the phase shifter 240 may directly receive the clock generated by the VCO 230 as the first reference clock signal REF_CLK[m]. The PFD 214 may generate the phase control signal based on the phase of the test clock signal TCLK_IN and a phase of the divided reference clock signal DIV and may output the phase control signal to the first charge pump circuit 216. For example, the PFD 214 may compare the phase of the test clock signal TCLK_IN with a phase of the divided reference clock signal DIV and may output the phase control signal generated based on the comparison result to the first charge pump circuit 216. The first charge pump circuit 216 may adjust charge supply in response to the phase control signal. The first LF 218 may generate a voltage signal by accumulating charges supplied by the first charge pump circuit 216 and may output the generated voltage signal to the VCO 230. As described above with reference to FIG. 1, the first PLL circuit 210 may perform the coarse phase fixing operation by using the test clock signal TCLK_IN and the first reference clock signal REF_CLK[m] in the training mode. Although not shown in FIG. 2, the first PLL circuit 210 may further include a dead zone circuit (not shown) for determining whether a phase difference between the test clock signal TCLK_IN and the divided reference clock signal DIV is positioned in the dead zone. When the phase difference is positioned in the dead zone, the coarse phase fixing operation is completed and the first PLL circuit 210 may be inactivated.

Referring to FIG. 3A, based on the UI of the test data signal TDATA_IN, when the coarse phase fixing operation of the first PLL circuit 210 is completed, the phase difference between the first reference clock signal REF_CLK[m] and the test data signal TDATA_IN may be positioned in a target window Target_WD. That is, the phase of the first reference clock signal REF_CLK[m] may be faster than that of the test data signal TDATA_IN within 0.5[UI] or may be slower than that of the test data signal TDATA_IN within 0.5[UI]. The target window Target_WD may be defined as the dead zone. In FIG. 3A, the target window Target_WD is set so that the phase difference is positioned within −0.5[UI] to +0.5[UI]. However, in some example embodiments, the target window Target_WD may be set to vary.

Referring to FIG. 3B, the test data signal TDATA_IN may have a prescribed pattern in the training mode. Therefore, the test data signal TDATA_IN may be represented as the test clock signal TCLK_IN transited from a low level to a high level at 'ta'. The test clock signal TCLK_IN and the first reference clock signal REF_CLK[m] pass through different paths in the first PLL circuit 210, and due to up/down charge mismatch of the first charge pump circuit 216, the test clock signal TCLK_IN and the first reference clock signal REF_CLK[m] may undergo different delays Delay_1 and Delay_2, respectively. Therefore, before the second PLL circuit 220 starts to perform the fine phase fixing operation, due to a delayed test clock signal TCLK_IN' and a delayed first reference clock signal REF_CLK[m]' in the first PLL circuit 210, the initial skew Skew_initial may be generated between the test clock signal TCLK_IN and the clock signal REF_CLK[m] inputted to the second PLL circuit 220.

Referring to FIG. 2 again, the second PLL circuit 220 according to an example embodiment of the inventive concepts may increase the edge detecting range for detecting the edge of the test clock signal TCLK_IN considering the initial skew Skew_initial in the training mode, and then may reduce the edge detecting range for detecting an edge of the input data signal DATA_IN (FIG. 1) in the normal mode in comparison with in the training mode.

The second PLL circuit 220 may include a sampling circuit 222, a phase detection circuit 224, a second charge pump circuit 226, and a second LF 228. The second PLL circuit 220 may perform the fine phase fixing operation subsequent to the coarse phase fixing operation of the first PLL circuit 210 in the training mode. The sampling circuit 222 may receive a plurality of second reference clock signals REF_CLK[n:0] and the test clock signal TCLK_IN and may sample the test clock signal TCLK_IN by using the plurality of second reference clock signals REF_CLK[n:0]. The plurality of second reference clock signals REF_CLK[n:0] may include reference clock signals delayed from the first reference clock signal REF_CLK[m] by the unit phase. The plurality of second reference clock signals REF_CLK[n:0] may further include the first reference clock signal REF_CLK[m]. The sampling circuit 222 may output sample signals Sample[n:0] generated by the sampling operation to the phase detection circuit 224.

The phase detection circuit 224 may generate the phase control signal for adjusting phases of the plurality of second reference clock signals REF_CLK[n:0] by selectively using sample signals corresponding to the selection reference clock signals among the sample signals Sample[n:0] in the training mode. In an example embodiment, by complementarily using the sample signals selected in the training mode, at a point in time of transition of a specific level of one sample signal, the phase detection circuit 224 may output another sample signal as the phase control signal, and at a point in time of transition of a specific level of the other sample signal, may output the one sample signal as the phase control signal. The selected sample signals may include at least one sample signal representing a result of detecting a rising edge of the test clock signal TCLK_IN and at least one sample signal representing a result of detecting the falling edge of the test clock signal TCLK_IN.

The phase detection circuit 224 may detect the edge of the test clock signal TCLK_IN by using the selected sample signals, among the sample signals, corresponding to the at least two selection reference clock signal, among the selection reference clock signals and may output the phase control signal generated based on the detection result to the second charge pump circuit 226. The second charge pump circuit 226 may adjust the charge supply in response to the phase control signal. The second LF 228 may generate the voltage signal by accumulating the charges supplied by the second charge pump circuit 226 and may output the generated voltage signal to the VCO 230. As described above with reference to FIG. 1, the second PLL circuit 220 may perform the fine phase fixing operation by using the test clock signal TCLK_IN and the selected reference clock signals (or the selected sample signals) in the training mode.

In the training mode, after the fine phase fixing operation of the second PLL circuit 220 is completed, the second PLL circuit 220 may operate in the normal mode. In the normal mode, the second PLL circuit 220 may receive the input data signal DATA_IN and may perform the fine phase fixing operation on the input data signal DATA_IN by using the plurality of second reference clock signals REF_CLK[n:0]. The second PLL circuit 220 may perform the fine phase fixing operation in the normal mode and may control the VCO 230 so that a clock signal output to the VCO 230 or a clock signal that passes through the phase shifter 240 has a phase that is the same as or similar to that of the normal clock signal included in the input data signal DATA_IN.

In FIG. 2, it is illustrated that the first PLL circuit 210 includes the first charge pump circuit 216 and the first LF 218, and the second PLL circuit 220 includes the second charge pump circuit 226 and the second LF 228. However, example embodiments of the inventive concepts are not limited thereto, and one charge pump circuit and/or one LF may be shared by the first PLL circuit 210 and the second PLL circuit 220.

Figure 4:
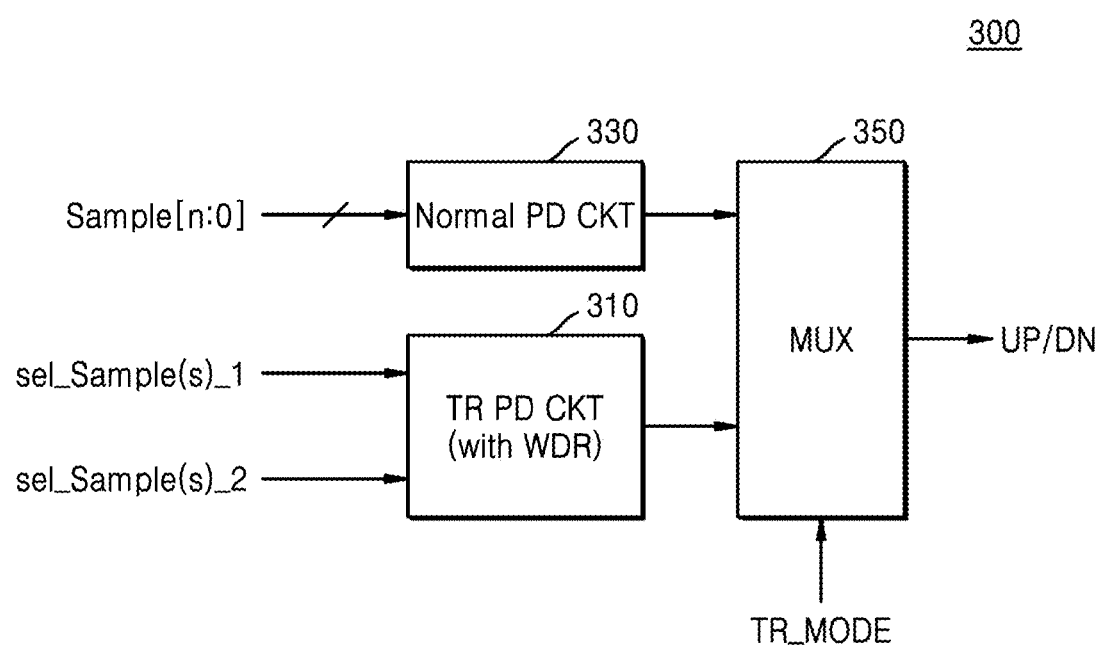
FIG. 4 is a block diagram illustrating a phase detection circuit according to an example embodiment of the inventive concepts.

FIG. 4 is a block diagram illustrating a phase detection circuit 300 according to an example embodiment of the inventive concepts.

Referring to FIG. 4, the phase detection circuit 300 may include a training phase detection circuit 310, a normal phase detection circuit 330, and a multiplexer 350. The multiplexer 350 may be connected to an output of the training phase detection circuit 310 and an output of the normal phase detection circuit 330 and may output one of the output of the training phase detection circuit 310 and the output of the normal phase detection circuit 330 as a phase control signal UP/DN based on a training mode signal TR_MODE.

The training phase detection circuit 310 may receive first select sample signals sel_Sample(s)_1 and second select sample signals sel_Sample(s)_2 among the sample signals Sample[n:0]. In an example embodiment, the first select sample signals sel_Sample(s)_1 may be used for detecting the rising edge of the test clock signal and the second select sample signals sel_Sample(s)_2 may be used for detecting the falling edge of the test clock signal. The first select sample signals sel_Sample(s)_1 may be generated by sampling the test clock signal TCLK_IN (FIG. 2) at rising edges of first selection reference clock signals in the sampling circuit 222 (FIG. 2) in the second PLL circuit 200 (FIG. 2), and the second select sample signals sel_Sample(s)_2 may be generated by sampling the test clock signal TCLK_IN (FIG. 2) at rising edges of second selection reference clock signals in the sampling circuit 222 (FIG. 2) in the second PLL circuit 200 (FIG. 2). The first selection reference clock signals may be predicted that the rising edges thereof are synchronized to be closest or close to the rising edge of the test data signal TDATA_IN (FIG. 1) or the test clock signal TCLK_IN (FIG. 2) as a result of the coarse phase fixing operation of the first PLL circuit 210 (FIG. 2). The second selection reference clock signals may be predicted that the rising edges thereof are synchronized to be closest or close to the falling edge of the test data signal TDATA_IN (FIG. 1) or the test clock signal TCLK_IN (FIG. 2) as a result of the coarse phase fixing operation of the first PLL circuit 210 (FIG. 2).

The training phase detection circuit 310 may output the phase control signal UP/DN through the multiplexer 350 by complementarily using the first select sample signals sel_Sample(s)_1 and the second select sample signals sel_Sample(s)_2, which will be described in detail later. The training phase detection circuit 310 may have an edge detecting range greater than that of the normal phase detection circuit 330 through the above-described operation.

The normal phase detection circuit 330 may output the phase control signal UP/DN through the multiplexer 350 by using the sample signals Sample[n:0]. As described above, the normal phase detection circuit 330 may have an edge detection range less than that of the training phase detection circuit 310.

Figure 5:
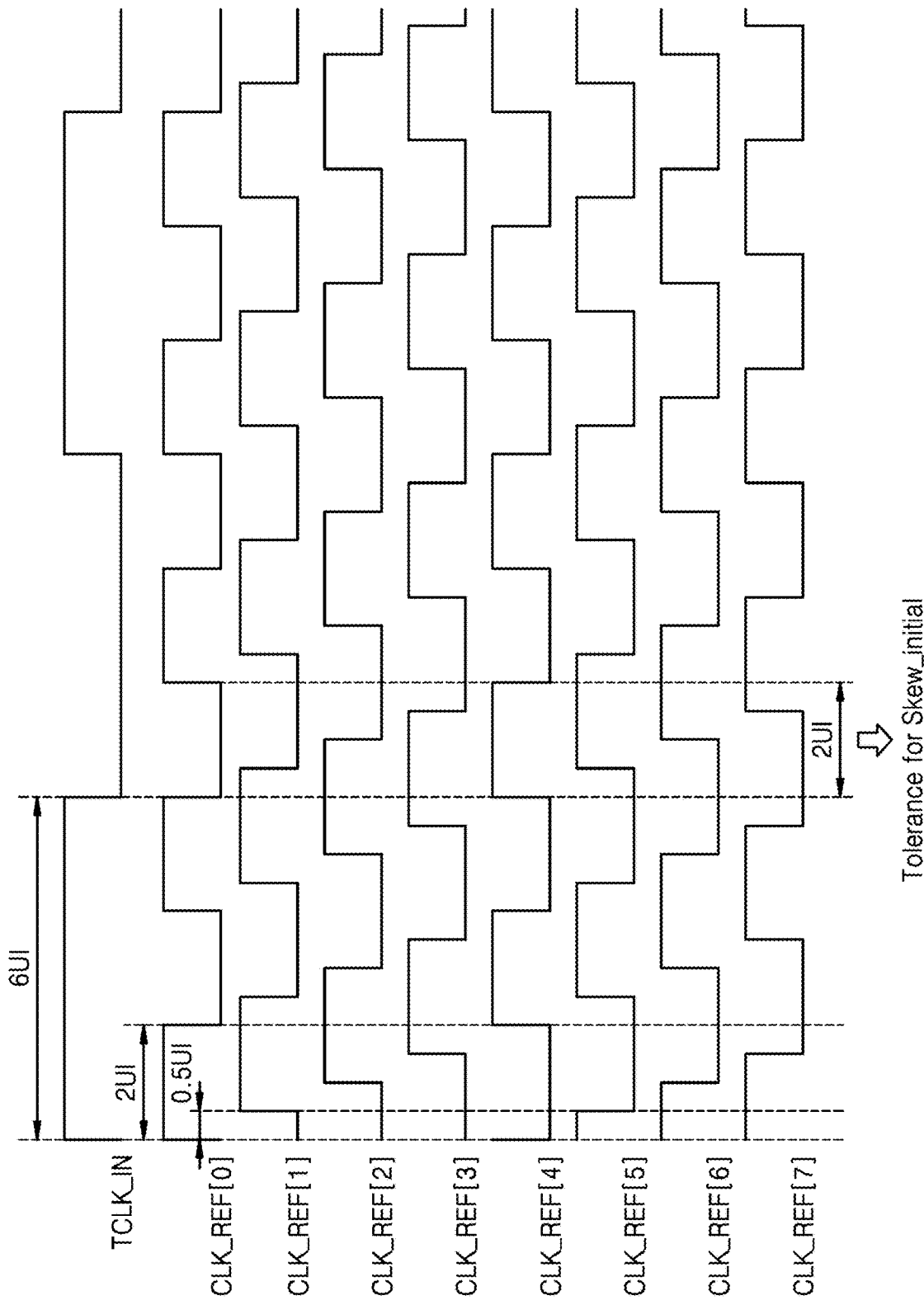
FIG. 5 is a timing diagram illustrating a test clock signal and reference clock signals according to an example embodiment of the inventive concepts.
Figure 6:
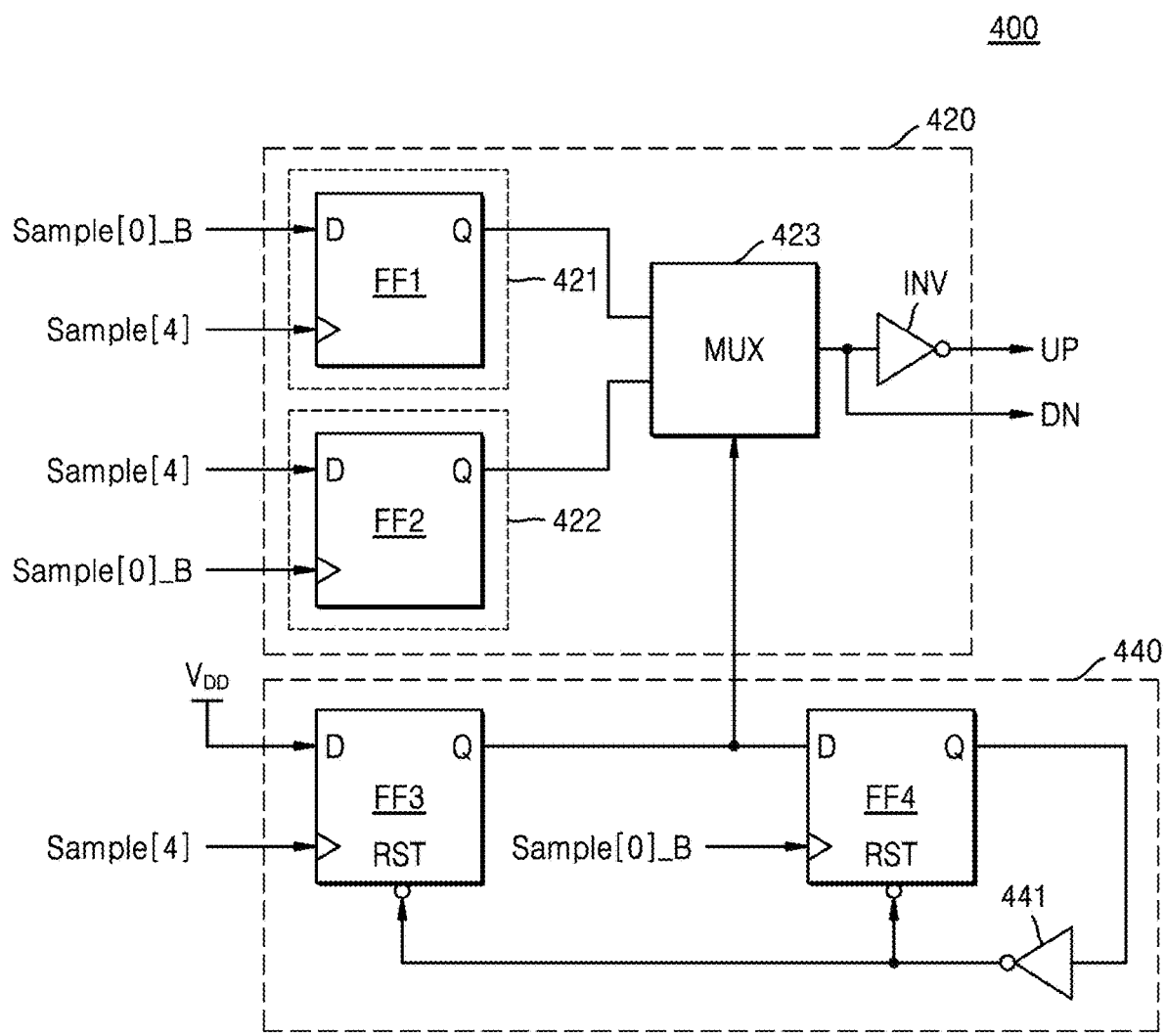
FIG. 6 is a block diagram illustrating a training phase detection circuit performing an edge detection operation of the test clock signal of FIG. 5 in a training mode.
Figure 7:
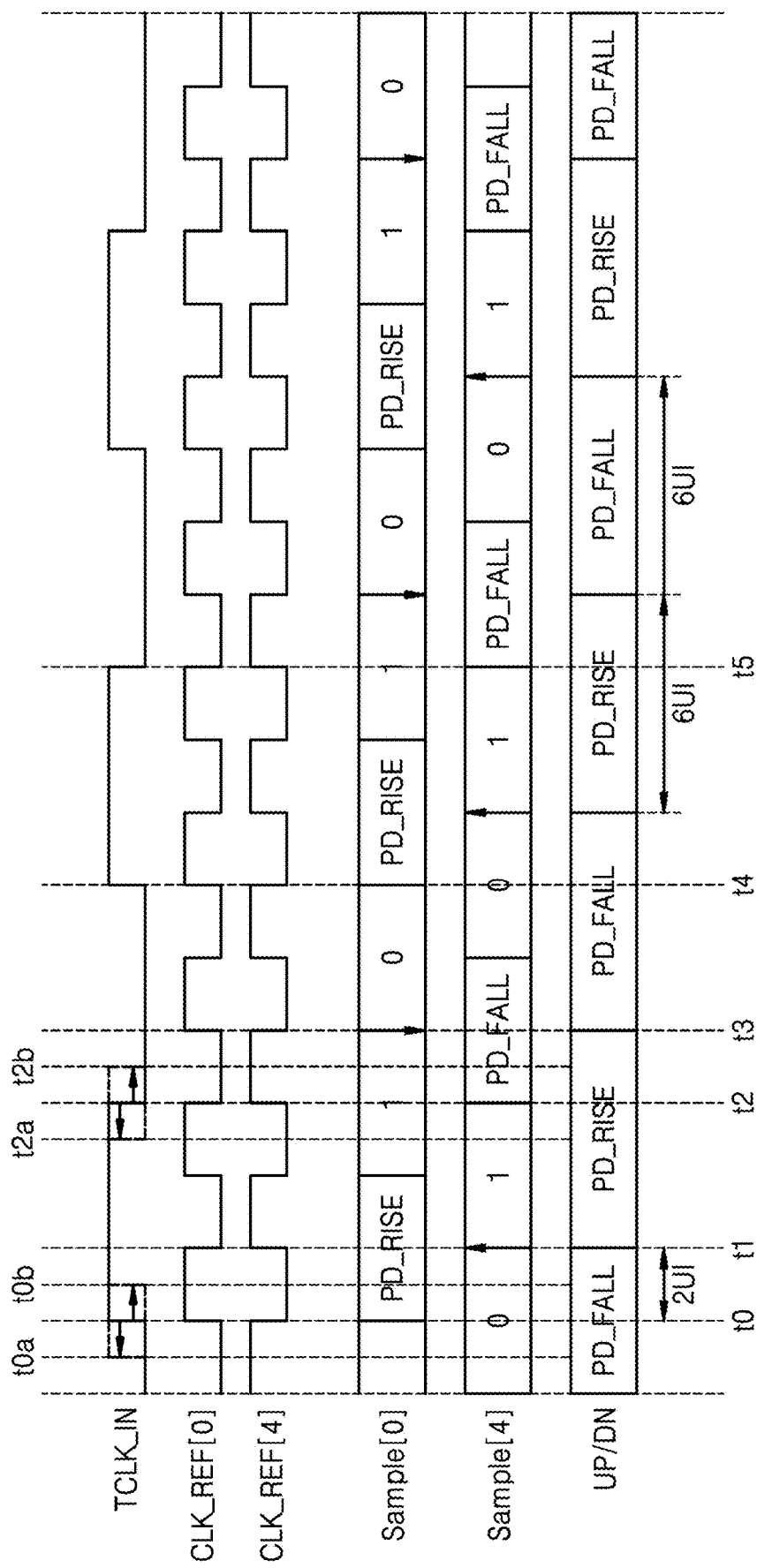
FIG. 7 is a timing diagram illustrating an operation of the training phase detection circuit of FIG. 6.

FIG. 5 is a timing diagram illustrating a test clock signal TCLK_IN and first to eighth reference clock signals CLK_REF[0] to CLK_REF[7] according to an example embodiment of the inventive concepts. FIG. 6 is a block diagram illustrating a training phase detection circuit 400 performing an edge detection operation of a test clock signal TCLK_IN of FIG. 5 in a training mode. FIG. 7 is a timing diagram illustrating an operation of the training phase detection circuit 400 of FIG. 6. The test clock signal TCLK_IN and the first to eighth reference clock signals CLK_REF[0] to CLK_REF[7] of FIG. 5 are only an example, the inventive concepts are not limited thereto and may also be applied to the test clock signal TCLK_IN of one of various patterns.

Referring to FIG. 5, a high level maintaining period of the test clock signal TCLK_IN may be the same as a low level maintaining period of the test clock signal TCLK_IN, and a level maintaining period of the test clock signal TCLK_IN may be 6[UI]. A level maintaining period of each of the first to eighth reference clock signals CLK_REF[0] to CLK_REF[7] may be 2[UI], and each of the first to eighth reference clock signals CLK_REF[0] to CLK_REF[7] may be delayed by 0.5[UI] step by step. In an example embodiment, a first reference clock signal CLK_REF[0] may be predicted that a rising edge thereof is synchronized to be closest or close to the rising edge of the test clock signal TCLK_IN as a result of the coarse phase fixing operation, and may correspond to a first selection reference clock signal and a fifth reference clock signal CLK_REF[4] may be predicted that a rising edge thereof is synchronized to be closest or close to the falling edge of the test clock signal TCLK_IN as a result of the coarse phase fixing operation, and may correspond to a second selection reference clock signal. A phase difference between the first selection reference clock signal CLK_REF[0] and the second selection reference clock signal CLK_REF[4] may be 180 degrees. The training phase detection circuit 400 of FIG. 6 to be described later may have tolerance of the initial skew Skew_initial of 2[UI] by generating the phase control signals UP/DN by using the first reference clock signal CLK_REF[0] and the fifth reference clock signal CLK_REF[4].

Referring to FIG. 6, the training phase detection circuit 400 may generate a first sample signal Sample[0] having a first level by sampling the test clock signal TCLK_IN (or alternatively, test data signal TDATA_IN) at a rising edge of the first reference clock signal CLK_REF[0], at a periodic first point in time, and may output the first sample signal Sample[0] having the first level at a point in time of transition of a level of the fifth sample signal Sample[4] subsequent to the first point in time as the phase control signals UP/DN for controlling phases of the first to eighth reference clock signals CLK_REF[0] to CLK_REF[7]. The training phase detection circuit 400 may generate the fifth sample signal Sample[4] having a second level by sampling the test clock signal TCLK_IN at a rising edge of the fifth reference clock signal CLK_REF[4], at a periodic second point in time, and may output the fifth sample signal Sample[4] having a second level at a point in time of transition of a level of the first sample signal Sample[0] subsequent to the second point in time as the phase control signals UP/DN for controlling the phases of the first to eighth reference clock signals CLK_REF[0] to CLK_REF[7]. A period of the periodic first point in time may correspond to a period of a rising edge of the test clock signal TCLK_IN, and a period of the periodic second point in time may correspond to a period of a falling edge of the test clock signal TCLK_IN.

In an example embodiment, the training phase detection circuit 400 may include an edge detection circuit 420 and an output control circuit 440. The edge detection circuit 420 (or alternatively, first phase detection circuit) may include a rising edge detection circuit (or alternatively, first training edge detector) 421, a falling edge detection circuit (or alternatively, second training edge detector) 422, a multiplexer 423, and a first inverter INV, and the output control circuit 440 may include third and fourth flip-flops FF3 and FF4 and a second inverter 441.

In an example embodiment, the rising edge detection circuit 421 may include a first flip-flop FF1 and the first flip-flop FF1 may receive an inverted first sample signal Sample[0]_B and the fifth sample signal Sample[4]. The falling edge detection circuit 422 may include a second flip-flop FF2, and the second flip-flop FF2 may receive the fifth sample signal Sample[4] and the inverted first sample signal Sample[0]_B. The multiplexer 423 may receive an output control signal from the output control circuit 440 and may selectively output one of the inverted first sample signal Sample[0]_B and the fifth sample signal Sample[4]. The output of the multiplexer 423 may be output as a first phase control signal UP through the first inverter INV or may be directly output as a second phase control signal DN. The rising edge detection circuit 421 may be configured to output the inverted first sample signal Sample[0]_B as a result of detecting a rising edge of the input data signal at a point in time of transition of a level of the fifth sample signal Sample[4]. The falling edge detection circuit 422 may be configured to output the fifth sample signal Sample[4] as a result of detecting a falling edge of the input data signal at a point in time of transition of a level of the inverted first sample signal Sample[0].

The third flip-flop FF3 in the output control circuit 440 may receive a power voltage $V_{DD}$ and the fifth sample signal Sample[4], and the fourth flip-flop FF4 may receive an output of the third flip-flop FF3 and the inverted first sample signal Sample[0]_B. An output of the fourth flip-flop FF4 may be provided to the third and fourth flip-flops FF3 and FF4 as a reset signal through the second inverter 441. The output of the third flip-flop FF3 may be provided to the multiplexer 423 as the output control signal.

Referring to FIG. 7, the sampling circuit 222 (FIG. 2) may sample the test clock signal TCLK_IN at a rising edge of the first reference clock signal CLK_REF[0] and may generate the first sample signal Sample[0]. The first sample signal Sample[0] may include a first signal PD_RISE representing a phase state of the test clock signal TCLK_IN every prescribed period. For example, the sampling circuit 222 (FIG. 2) may generate the first signal PD_RISE by sampling the test clock signal TCLK_IN at the rising edge of 't0' of the first reference clock signal CLK_REF[0], and may generate the first signal PD_RISE again at 't4' after a prescribed time. At this time, a period in which the first signal PD_RISE is generated may be three times a period of the first reference clock signal CLK_REF[0]. The sampling circuit 222 (FIG. 2) may generate the fifth sample signal Sample[4] by sampling the test clock signal TCLK_IN at a rising edge of the fifth reference clock signal CLK_REF[4]. At 't1', when the fifth sample signal Sample[4] is transited from '0' to '1', the training phase detection circuit 400 may output the first signal PD_RISE as the phase control signal UP/DN. For example, when the test clock signal TCLK_IN has a rising edge at 't0a', the first signal PD_RISE may have the value '1', which means that the first reference clock signal CLK_REF[0] is slower than the test clock signal TCLK_IN. Therefore, the training phase detection circuit 400 may output the phase control signals UP/DN (for example, the first phase control signal UP having the value '1' and the second phase control signal DN having the value '0') for advancing phases of reference clock signals including the first reference clock signal CLK_REF[0]. In addition, when the test clock signal TCLK_IN has a rising edge at 't0b', the first signal PD_RISE may have the value '0', which means that the first reference clock signal CLK_REF[0] is faster than the test clock signal TCLK_IN. Therefore, the training phase detection circuit 400 may output the phase control signals UP/DN (for example, the first phase control signal UP having the value '0' and the second phase control signal DN having the value '1') for delaying the phases of the reference clock signals including the first reference clock signal CLK_REF[0].

The fifth sample signal Sample[4] may include a second signal PD_FALL representing the phase state of the test clock signal TCLK_IN every prescribed period. For example, the sampling circuit 222 (FIG. 2) may generate the second signal PD_FALL by sampling the test clock signal TCLK_IN at the rising edge of 't2' of the fifth reference clock signal CLK_REF[4], and may generate the second signal PD_FALL again at 't5' after a prescribed time. At this time, a period in which the second signal PD_FALL is generated may be three times the period of the fifth reference clock signal CLK_REF[4]. At 't3', when the first sample signal Sample[0] is transited from '1' to '0', the training phase detection circuit 400 may output the second signal PD_FALL as the phase control signal UP/DN. For example, when the test clock signal TCLK_IN has a falling edge at 't2a', the second signal PD_FALL may have the value '0', which means that the fifth reference clock signal CLK_REF[4] is slower than the test clock signal TCLK_IN. Therefore, the training phase detection circuit 400 may output the phase control signals UP/DN (for example, the first phase control signal UP having the value '1' and the second phase control signal DN having the value '0') for advancing the phases of the reference clock signals including the fifth reference clock signal CLK_REF[4]. In addition, when the test clock signal TCLK_IN has a falling edge at 't2b', the second signal PD_FALL may have the value '1', which means that the fifth reference clock signal CLK_REF[4] is faster than the test clock signal TCLK_IN. Therefore, the training phase detection circuit 400 may output the phase control signals UP/DN (for example, the first phase control signal UP having the value '0' and the second phase control signal DN having the value '1') for delaying the phases of the reference clock signals including the fifth reference clock signal CLK_REF[4].

Through the configuration of the training phase detection circuit 400 of FIG. 6 and the operation of FIG. 7, the training phase detection circuit 400 may have the edge detecting range of 2[UI] and each of the first signal PD_RISE and the second signal PD_FALL output as the phase control signal UP/DN may have the same width of 6[UI]. FIGS. 6 and 7 are only example embodiments, the inventive concepts are not limited thereto and various implementation examples, in which the training phase detection circuit 400 may have a wide edge detecting range by outputting one of the sample signals as the phase control signal by complementarily using the sample signals generated by using the selection reference clock signals, may be applied.

Figure 8:
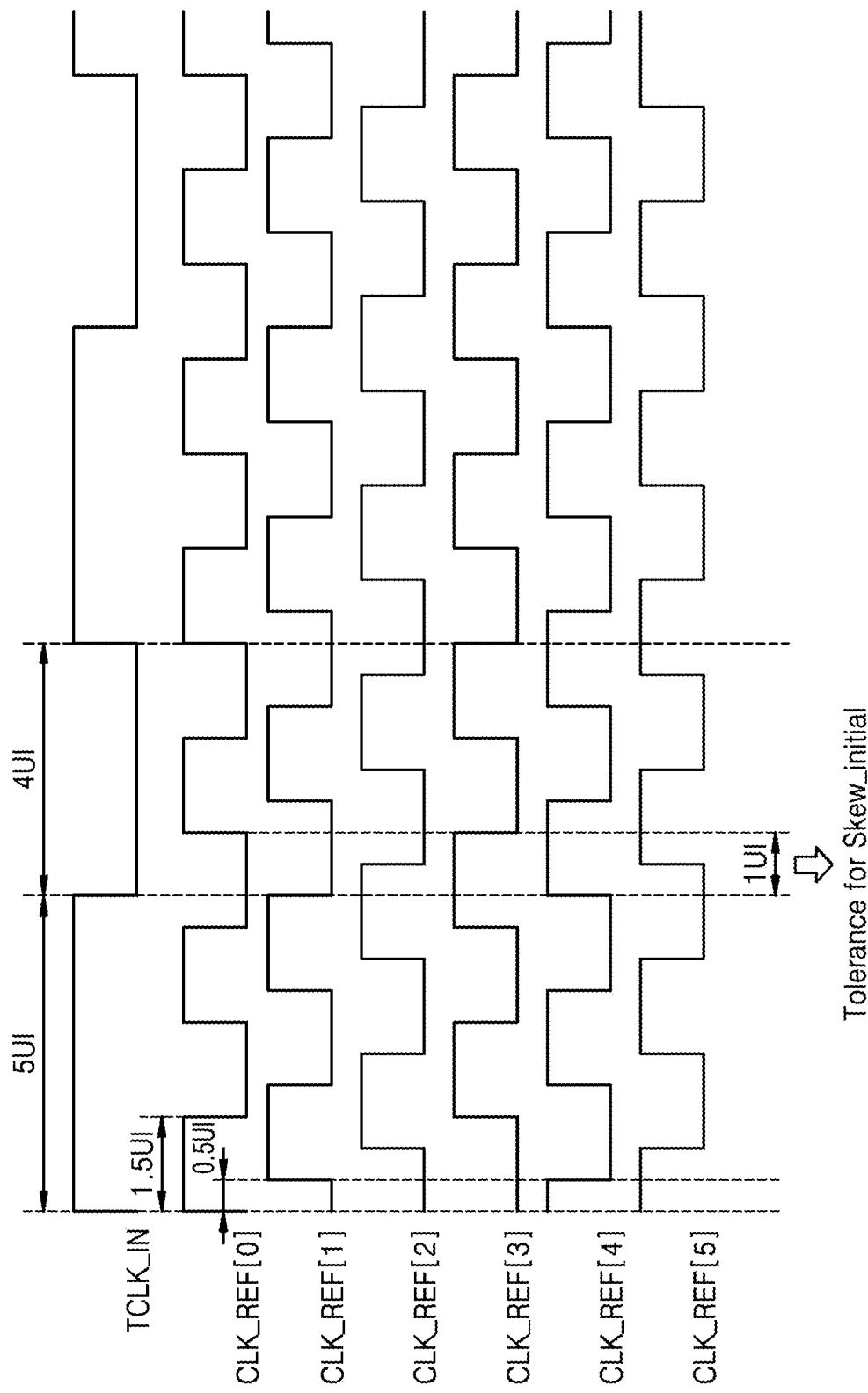
FIG. 8 is a timing diagram illustrating a test clock signal and reference clock signals according to an example embodiment of the inventive concepts.
Figure 9:
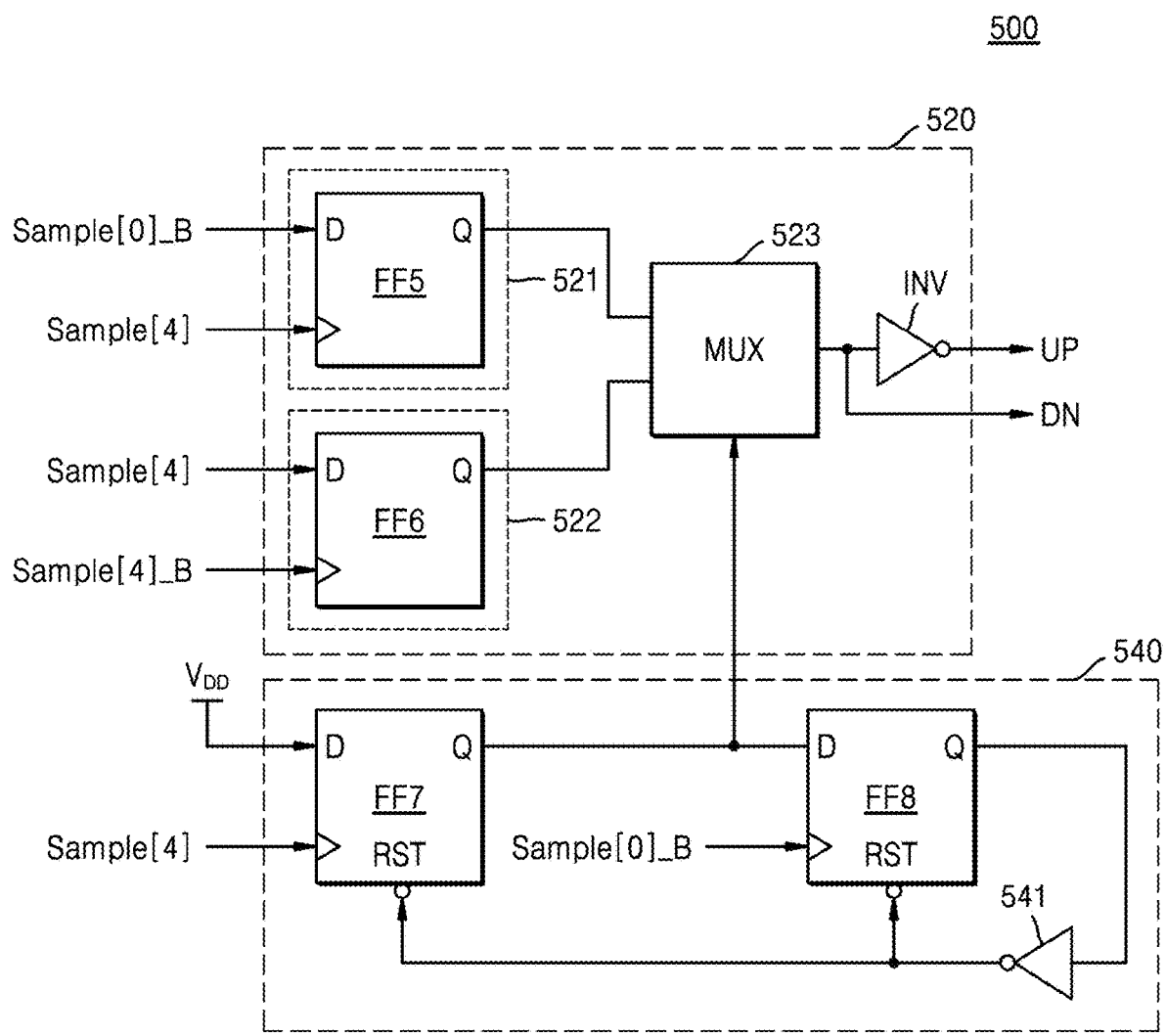
FIG. 9 is a block diagram illustrating a training phase detection circuit performing an edge detection operation of the test clock signal of FIG. 8 in a training mode.
Figure 10:
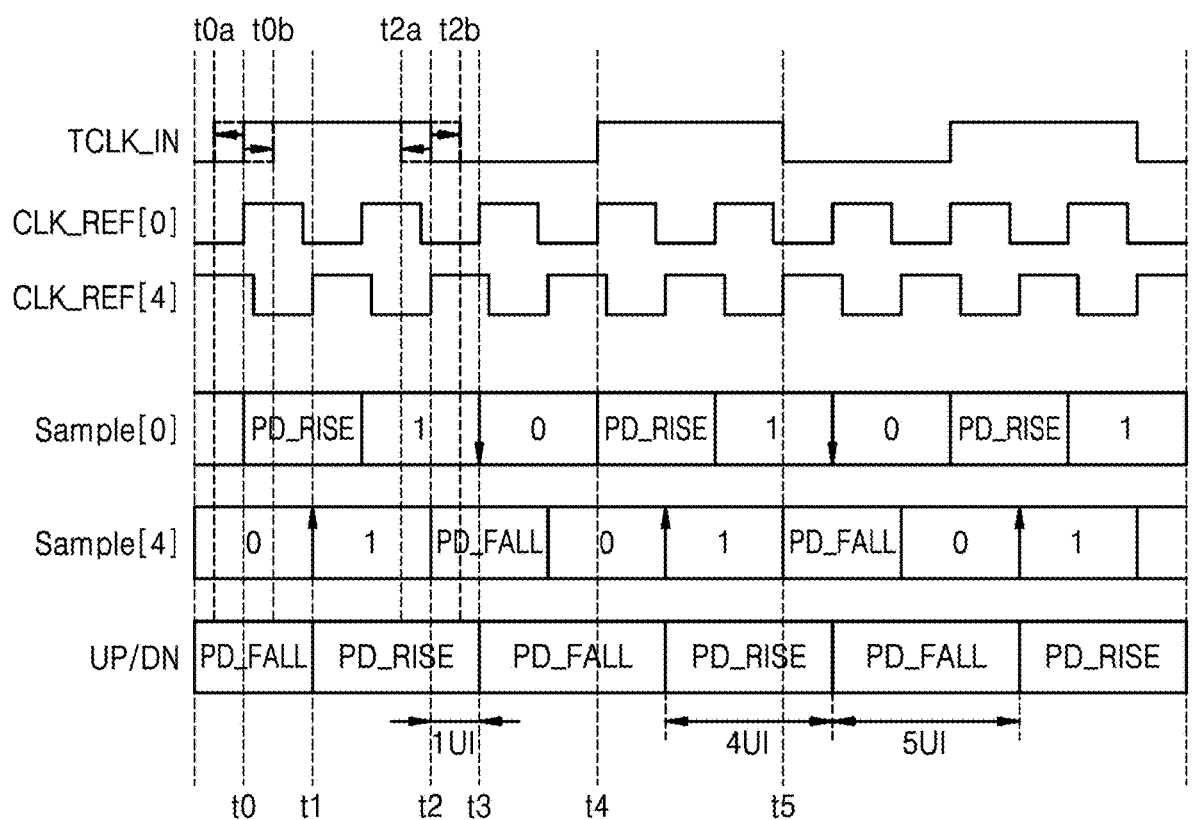
FIG. 10 is a timing diagram illustrating an operation of the training phase detection circuit of FIG. 9.

FIG. 8 is a timing diagram illustrating a test clock signal TCLK_IN and reference clock signals CLK_REF[0] to CLK_REF[5] according to an example embodiment of the inventive concepts. FIG. 9 is a block diagram illustrating a training phase detection circuit 500 performing an edge detection operation of the test clock signal TCLK_IN of FIG. 8 in a training mode. FIG. 10 is a timing diagram illustrating an operation of the training phase detection circuit 500 of FIG. 9.

Referring to FIG. 8, the high level maintaining period of the test clock signal TCLK_IN may be different from the low level maintaining period of the test clock signal TCLK_IN. For example, the high level maintaining period may be 5[UI] and the low level maintaining period may be 4[UI]. A level maintaining period of each of the first to sixth reference clock signals CLK_REF[0] to CLK_REF[5] may be 1.5[UI] and each of the first to sixth reference clock signals CLK_REF[0] to CLK_REF[5] may be delayed by 0.5[UI] step by step. In an example embodiment, the first reference clock signal CLK_REF[0] may be predicted that the rising edge thereof is synchronized to be closest or close to the rising edge of the test clock signal TCLK_IN as the result of the coarse phase fixing operation, and may correspond to the first selection reference clock signal and the fifth reference clock signal CLK_REF[4] may be predicted that the rising edge thereof is synchronized to be closest or close to the falling edge of the test clock signal TCLK_IN as the result of the coarse phase fixing operation and may correspond to the second selection reference clock signal. A phase difference between the first selection reference clock signal CLK_REF[0] and the second selection reference clock signal CLK_REF[4] may be 120 degrees. The training phase detection circuit 500 of FIG. 9 to be described later may have tolerance of the initial skew Skew_initial of 1[UI] by generating the phase control signals UP/DN by using the first reference clock signal CLK_REF[0] and the fifth reference clock signal CLK_REF[4].

Referring to FIG. 9, the training phase detection circuit 500 may include an edge detection circuit 520 and an output control circuit 540. The edge detection circuit 520 may include a rising edge detection circuit 521, a falling edge detection circuit 522, a multiplexer 523, and a first inverter INV and the output control circuit 540 may include third and fourth flip-flops FF7 and FF8 and a second inverter 541.

In an example embodiment, the rising edge detection circuit 521 may include a first flip-flop FF5 and the first flip-flop FF5 may receive the inverted first sample signal Sample[0]_B and the fifth sample signal Sample[4]. The falling edge detection circuit 522 may include a second flip-flop FF6, and the second flip-flop FF6 may receive the fifth sample signal Sample[4] and the inverted first sample signal Sample[0]_B. The multiplexer 523 may receive an output control signal from the output control circuit 540 and may selectively output one of the inverted first sample signal Sample[0]_B and the fifth sample signal Sample[4]. The output of the multiplexer 523 may be output as the first phase control signal UP through the first inverter INV or may be directly output as the second phase control signal DN.

The third flip-flop FF7 in the output control circuit 540 may receive the power voltage $V_{DD}$ and the fifth sample signal Sample[4], and the fourth flip-flop FF8 may receive an output of the third flip-flop FF7 and the inverted first sample signal Sample[0]_B. An output of the fourth flip-flop FF8 may be provided to the third and fourth flip-flops FF7 and FF8 as a reset signal through the second inverter 541. The output of the third flip-flop FF7 may be provided to the multiplexer 523 as the output control signal.

Referring to FIG. 10, because a pattern of the test clock signal TCLK_IN of FIG. 10 is different from that of the test clock signal TCLK_IN of FIG. 7, the phase detection circuit 500 may have an edge detecting range of 1[UI] and the first signal PD_RISE and the second signal PD_FALL output as the phase control signals UP/DN may have different widths of 4[UI] and 5[UI]. Otherwise, because the operation of the phase detection circuit 500 of FIG. 10 is the same as that of the phase detection circuit 400 of FIG. 7, detailed description thereof will not be given.

Figure 11:
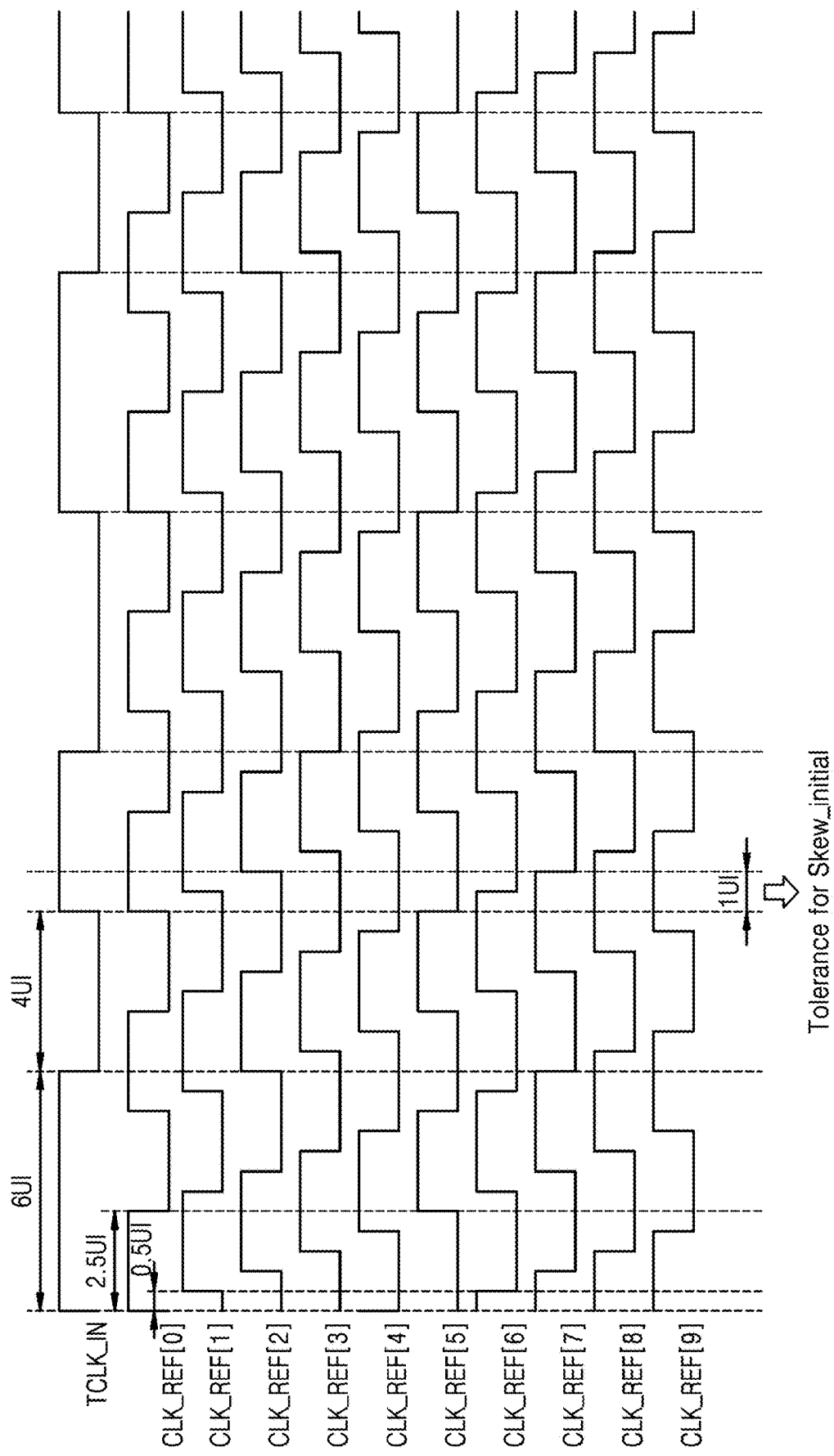
FIG. 11 is a timing diagram illustrating a test clock signal and reference clock signals according to an example embodiment of the inventive concepts.
Figure 12:
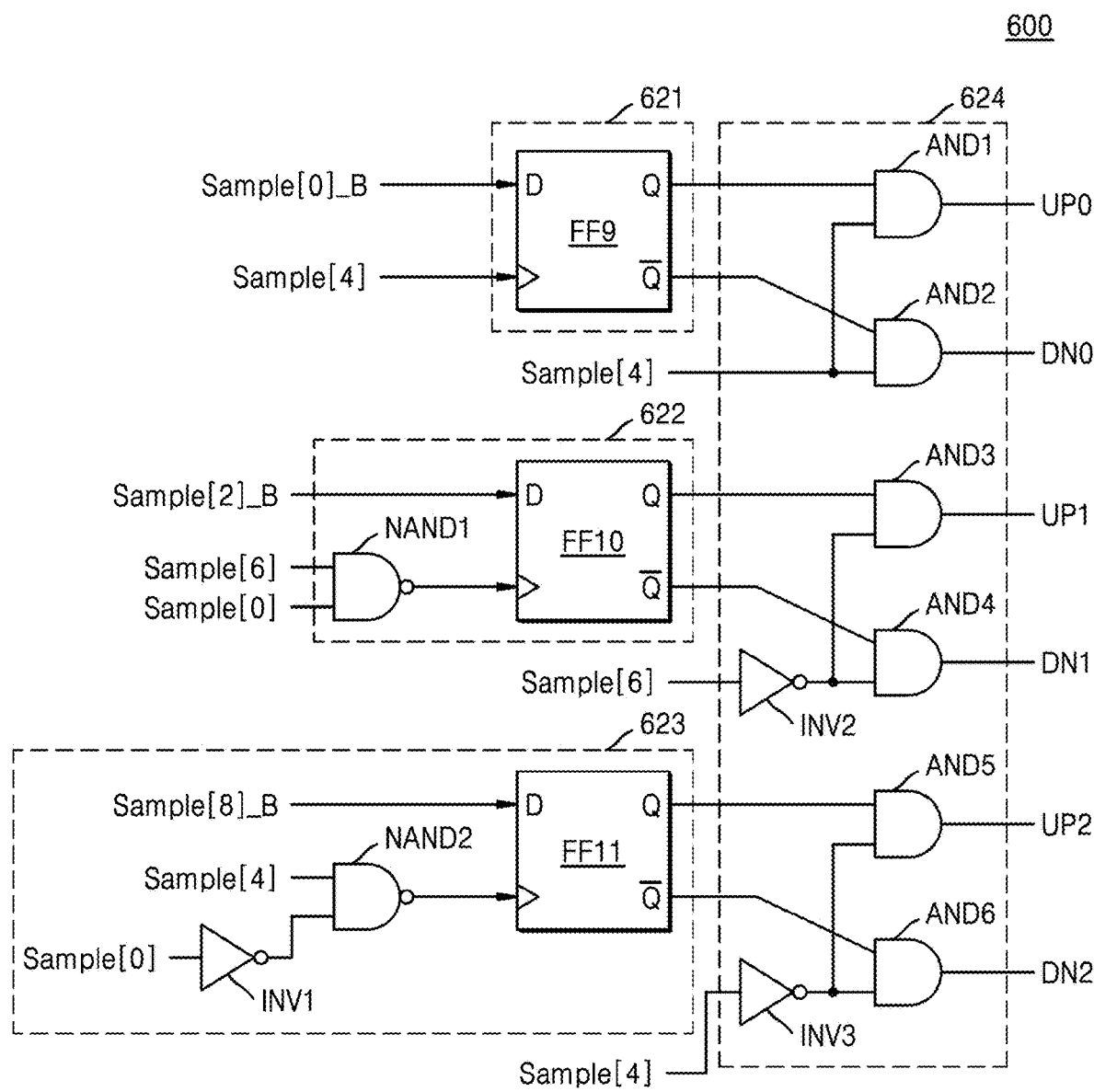
FIG. 12 is a block diagram illustrating a training phase detection circuit performing an edge detection operation of the test clock signal of FIG. 11 in a training mode.
Figure 13:
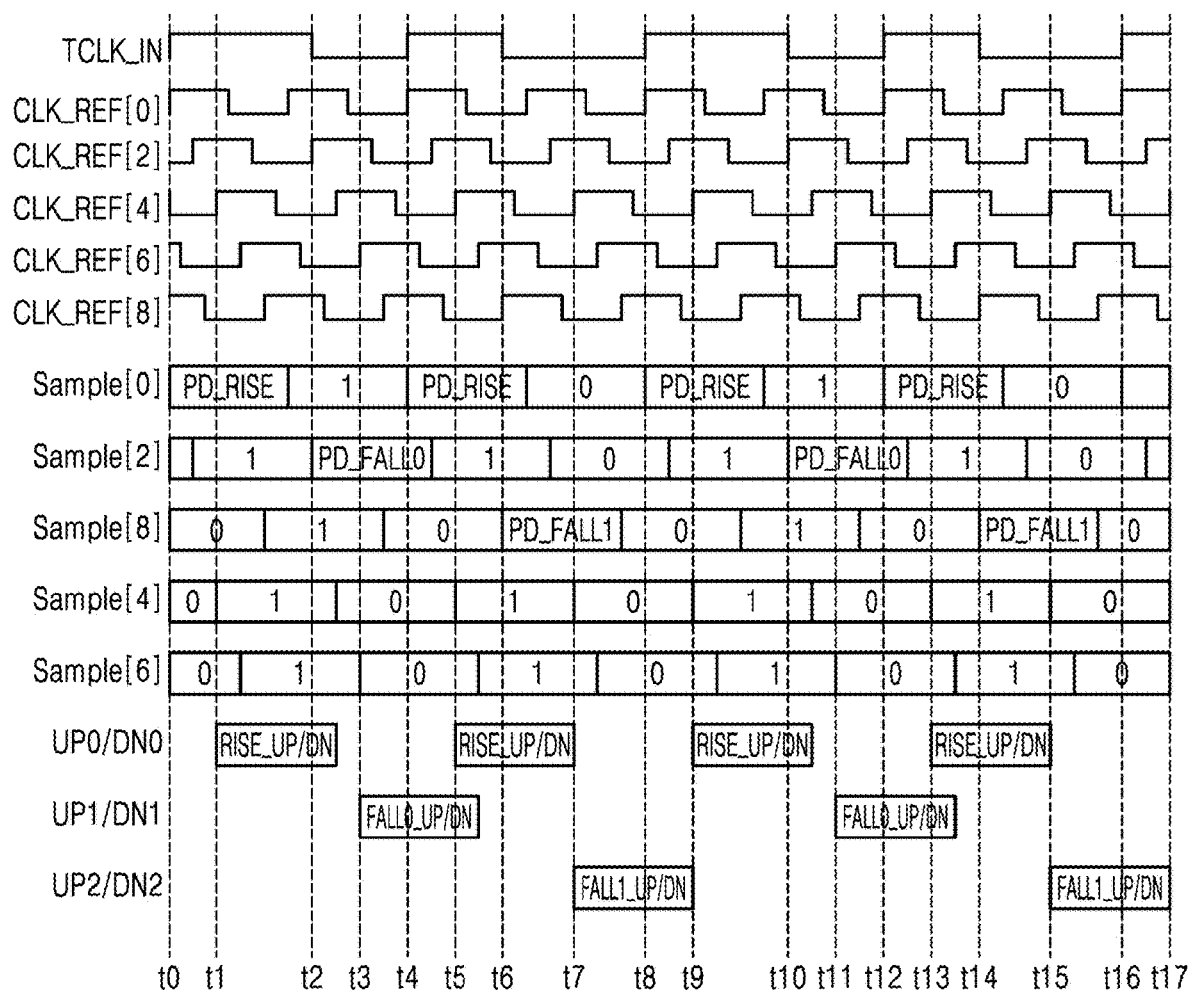
FIG. 13 is a timing diagram illustrating an operation of the training phase detection circuit of FIG. 12.

FIG. 11 is a timing diagram illustrating a test clock signal TCLK_IN and reference clock signals CLK_REF[0] to CLK_REF[9] according to an example embodiment of the inventive concepts. FIG. 12 is a block diagram illustrating a training phase detection circuit 600 performing an edge detection operation of the test clock signal TCLK_IN of FIG. 11 in a training mode. FIG. 13 is a timing diagram illustrating an operation of the training phase detection circuit 600 of FIG. 12.

Referring to FIG. 11, each of the high level maintaining period and the low level maintaining period of the test clock signal TCLK_IN may be changed into one of 6[UI] and 4[UI], respectively. Each of the first to tenth reference clock signals CLK_REF[0] to CLK_REF[9] may be delayed by 0.5[UI] step by step. In an example embodiment, the first reference clock signal CLK_REF[0] may be predicted that the rising edge thereof is synchronized to be closest or close to the rising edge of the test clock signal TCLK_IN as the result of the coarse phase fixing operation and may correspond to the first selection reference clock signal CLK_REF[0], and the third reference clock signal CLK_REF[2] and the ninth reference clock signal CLK_REF[8] may be predicted that rising edges thereof are synchronized to be closest or close to the falling edge of the test clock signal TCLK_IN as the result of the coarse phase fixing operation and may correspond to second selection reference clock signals. A phase difference between the first selection reference clock signal CLK_REF[0] and one second selection reference clock signal CLK_REF[2] may be 72 degrees and a phase difference between the first selection reference clock signal CLK_REF[0] and the other second reference clock signal CLK_REF[8] may be 288. The training phase detection circuit 600 of FIG. 12 to be described later may have tolerance of the initial skew Skew_initial of 1[UI] by generating the phase control signals UP/DN by using the first reference clock signal CLK_REF[0], the third reference clock signal CLK_REF[2], and the ninth reference clock signal CLK_REF[8].

Referring to FIG. 12, the training phase detection circuit 600 may include a rising edge detection circuit 621, a falling edge detection circuit 622, a second falling edge detection circuit 623, and a phase control signal generating circuit 624. In an example embodiment, the rising edge detection circuit 621 may include a first flip-flop FF9 and the first flip-flop FF9 may receive the inverted first sample signal Sample[0]_B and the fifth sample signal Sample[4]. The first falling edge detection circuit 622 may include a first NAND gate NAND1 and a second flip-flop FF10. The first NAND gate NAND1 may receive a seventh sample signal Sample[6] and the first sample signal Sample[0], and the second flip-flop FF10 may receive an output of the first NAND gate NAND1 and the inverted third sample signal Sample[2]. The second falling edge detection circuit 623 may include a first inverter INV1, a second NAND gate NAND2, and a third flip-flop FF11. The first inverter INV1 may receive the first sample signal Sample[0], the second NAND gate NAND2 may receive an output of the first inverter INV1 and the fifth sample signal Sample[4], and the third flip-flop FF11 may receive an output of the second NAND gate NAND2 and the inverted ninth sample signal Sample[8].

The phase control signal generating circuit 624 may include second and third inverters INV2 and INV3 and first to sixth AND gates AND1 to AND6. The first AND gate AND1 may receive an output of the first flip-flop FF9 and the fifth sample signal Sample[4] and may output a first phase control signal UP0. The second AND gate AND2 may receive an inverted output of the first flip-flop FF and the fifth sample signal Sample[4] and may output a second phase control signal DN0. The third AND gate AND3 may receive an output of the second flip-flop FF10 and the seventh sample signal Sample[6] inverted by the second inverter INV2 and may output a third phase control signal UP1. The fourth AND gate AND4 may receive an inverted output of the second flip-flop FF10 and the seventh sample signal Sample[6] inverted by the second inverter INV2 and may output a fourth phase control signal DN1. The fifth AND gate AND5 may receive an output of the third flip-flop FF11 and the fifth sample signal Sample[4] inverted by the third inverter INV3 and may output a fifth phase control signal UP2. The sixth AND gate AND6 may receive an inverted output of the third flip-flop FF11 and the fifth sample signal Sample[4] inverted by the third inverter INV3 and may output a sixth phase control signal DN2.

The fifth sample signal Sample[4] and the seventh sample signal Sample[6] of FIG. 12, which are used to generated the phase control signals UP1 to UP3 and DN1 to DN3, may be generated by using the fifth reference clock signal CLK_REF[4] and the seventh reference clock signal CLK_REF[6], respectively.

Referring to FIG. 13, the first signal PD_RISE generated at 't0' to represent a phase state by detecting the rising edge of the test clock signal TCLK_IN may be output as the phase control signal UP0/DN0 at 't1' through the training phase detection circuit 600, a second signal PD_FALL0 generated at 't2' to represent a phase state by detecting the falling edge of the test clock signal TCLK_IN may be output as the phase control signal UP1/DN1 at 't3' through the training phase detection circuit 600, and the second signal PD_FALL0 generated at 't6' to represent a phase state by detecting the falling edge of the test clock signal TCLK_IN may be output as the phase control signal UP2/DN2 at 't7' through the training phase detection circuit 600.

To make it short, the first signal PD_RISE may be periodically generated at 't0', 't4', 't8', and 't12' and may be output as the phase control signal UP0/DN0 at 't1', 't5', 't9', and 't13'. The second signal PD_FALL0 may be periodically generated at 't2' and 't10' and may be output as the phase control signal UP1/DN1 at 't3' and '01'. The third signal PD_FALL1 may be periodically generated at 't6' and 't14' and may be output as the phase control signal UP1/DN1 at 't7' and 't15'.

Figure 14:
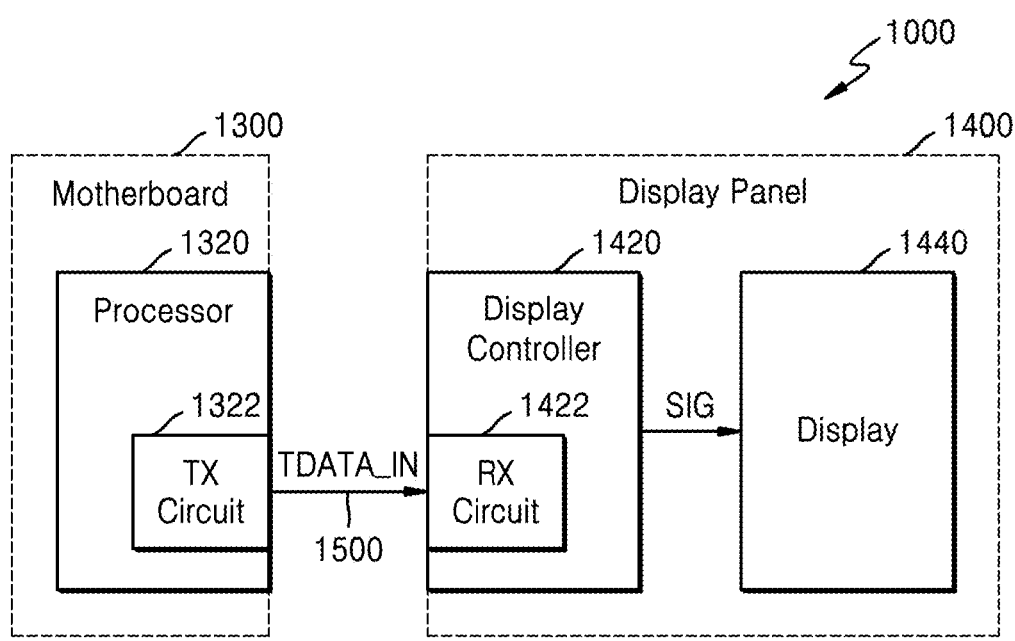
FIG. 14 is a block diagram illustrating an apparatus including a clock data recovery circuit according to an example embodiment of the inventive concepts.

FIG. 14 is a block diagram illustrating an apparatus 1000 including a clock data recovery circuit according to an example embodiment of the inventive concepts.

The clock data recovery circuit according to an example embodiment of the inventive concepts may include a receiving circuit 1422. The apparatus 1000 may be a computing system including a display panel 1400 (e.g., a stationary system such as a desktop computer, a server, a TV, or an electronic display or a mobile system such as a laptop computer, a mobile phone, a tablet PC, or a wearable device as non-limiting examples). As illustrated in FIG. 14, the apparatus 1000 may include a mother board 1300 and the display panel 1400 and the test data signal TDATA_IN may be transmitted from the mother board 1300 to the display panel 1400 through a data line 1500.

The mother board 1300 may include a processor 1320, and the processor 1320 may include a transmission circuit 1322. The processor 1320 may refer to a processing circuitry performing a computational operation such as a microprocessor, a microcontroller, an application specific integrated circuit (ASIC), or a field programmable gate array (FPGA).

In some example embodiments, the processor 1320 may be a video graphic processor such as a graphics processing unit (GPU). The processor 1320 may generate image data corresponding to an image output through a display 1440 included in the display panel 1400 and may provide the image data to the transmission circuit 1322.

The transmission circuit 1322 may generate the test data signal TDATA_IN for training the receiving circuit 1422 and may output the test data signal TDATA_IN to the receiving circuit 1422. The display panel 1400 may include a display controller 1420 and the display 1440. The display controller 1420 may receive the test data signal TDATA_IN from the mother board 1300 and may perform a data clock recovery operation in the training mode by using the test data signal TDATA_IN. In some example embodiments, the display controller 1420 may provide a display signal SIG for controlling pixels included in the display 1440 and may be referred to as a display driver integrated circuit (DDI).

The display controller 1420 may include the receiving circuit 1422, and the receiving circuit 1422 may receive the test data signal TDATA_IN. The receiving circuit 1422 may include the clock data recovery circuit according to example embodiments of the inventive concepts and may recover a test clock signal and test data from the test data signal TDATA_IN. As described above, according to example embodiments of the inventive concepts, the clock data recovery circuit included in the receiving circuit 1422 may have the edge detecting range during an operation of recovering the test data signal TDATA_IN in the training mode greater than that in the normal mode so that the recovery operation may be correctly performed.

The display 1440 may include an arbitrary type of display such as a liquid crystal display (LCD), a light emitting diode (LED) display, an electroluminescent display (ELD), a cathode ray tube (CRT) display, a plasma display panel (PDP) display, or a liquid crystal on silicon (LCoS) display as a non-limiting example. In addition, in FIG. 14, the apparatus 1000 is illustrated as including one display panel 1400. However, in some example embodiments, the apparatus 1000 may include no less than two display panels, that is, no less than two displays.

Figure 15:
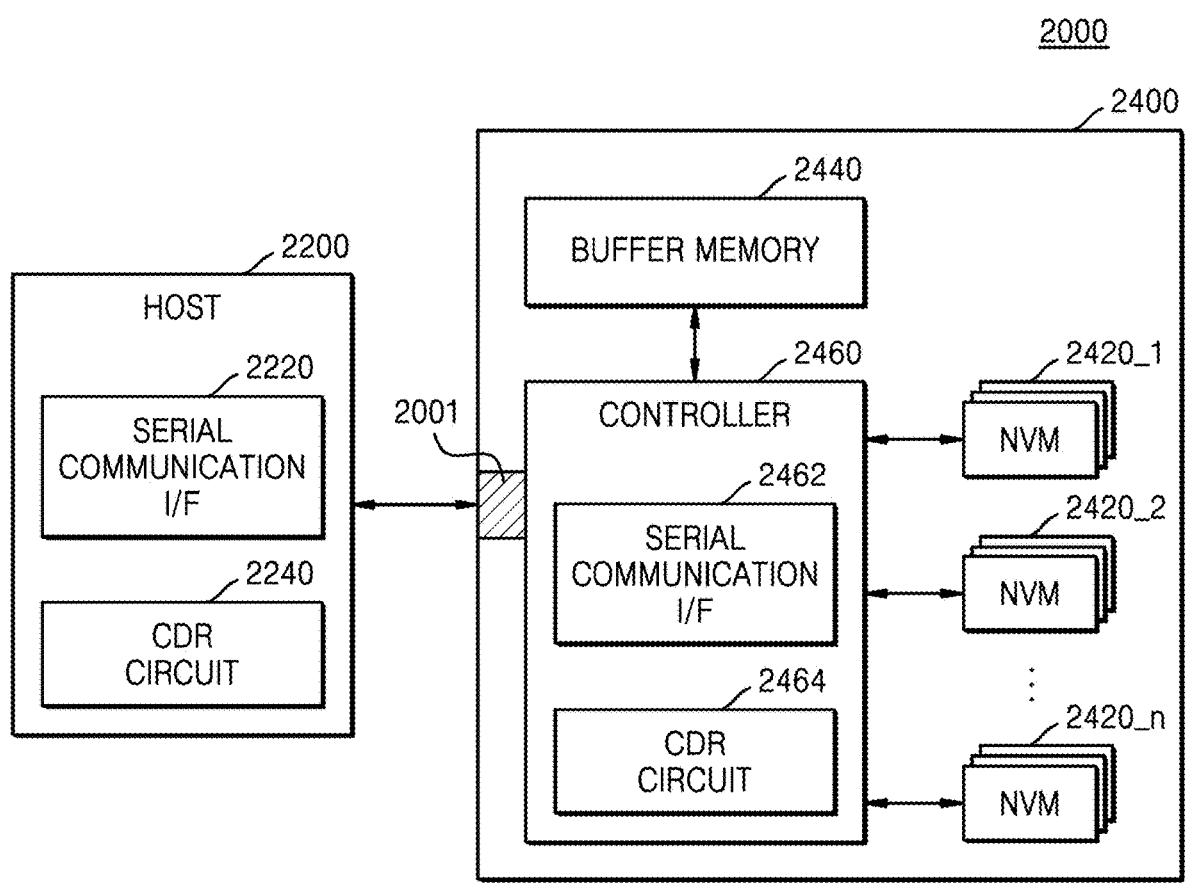
FIG. 15 is a block diagram illustrating a system including a clock data recovery circuit according to an example embodiment of the inventive concepts.

FIG. 15 is a block diagram illustrating a system 2000 including clock data recovery circuits 2240 and 2464 according to an example embodiment of the inventive concepts.

Referring to FIG. 15, the system 2000 may include a host 2200 and a storage device 2400. The storage device 2400 may be referred to as a memory system or a storage system and may include a signal connector 2001, a plurality of non-volatile memories 2420_1 to 2420_n, a buffer memory 2440, and a controller 2460. For example, the controller 2460 may be referred to as a memory controller or a storage controller.

The storage device 2400 may transmit and receive a signal to and from the host 2200 through the signal connector 2001. The host 2200 and the storage device 2400 may communicate through an electrical signal and/or an optical signal and, as a non-limiting example, may communicate through a universal flash storage (UFS), a serial advanced technology attachment (SATA), an SATA express (SATAe), a small computer small interface (SCSI), a serial attached SCSI (SAS), a peripheral component interconnect express (PCIe), a non-volatile memory express (NVMe), an advanced host controller interface (AHCI), or a combination of the above units.

The controller 2460 may control the plurality of non-volatile memories 2420_1 to 2420_n in response to the signal received from the host 2200. The controller 2460 may include a serial communication interface circuit 2462 for data transmission and reception and may include the clock data recovery circuit 2464 to which example embodiments of the inventive concepts are applied in order to recover a clock signal and data of a received serial data signal. The serial communication interface circuit 2462 may provide a communication interface such as the UFS, the SATA, the SATAe, the SCSI, the SAS, the PCIe, the NVMe, or the AHCI. The buffer memory 2440 may operate as buffer memory of the storage device 2400. On the other hand, the host 2200 may also include the serial communication interface circuit 2220 for transmitting and receiving data and the clock data recovery circuit 2240 to which example embodiments of the inventive concepts are applied.

Each of the non-volatile memories 2420_1 to 2420_n may include a memory cell array. The memory cell array may include memory blocks. Each of the memory blocks may be divided into pages. Each of the pages may include non-volatile memory cells, for example, at least one NAND flash memory cell.

One or more of the various elements may be implemented by processing circuitry such as hardware including logic circuits, a hardware/software combination such as a processor executing. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While the inventive concepts has been particularly shown and described with reference to some example embodiments thereof, it will be understood that various changes in form and details may be made therein without departing from the spirit and scope of the following claims.

What is claimed is:

1. A clock recovery circuit comprising:
    a first phase-locked loop (PLL) circuit configured to perform a coarse phase fixing operation on a test data signal by using a first reference clock signal, the test data signal having a prescribed pattern; and
    a second PLL circuit configured to perform a fine phase fixing operation on the test data signal, subsequently to the coarse phase fixing operation,
    wherein the second PLL circuit is configured to perform the fine phase fixing operation on the test data signal by selectively using at least two selection reference clock signals among a plurality of second reference clock signals that are delayed from the first reference clock signal by a unit phase, in a training mode, having a phase difference of N times the unit phase, where N is an integer equal to or greater than 2, and
    wherein the clock recovery circuit is configured to inactivate the first PLL circuit and cause the second PLL circuit to perform a fine phase fixing operation on a normal data signal by using the plurality of second reference clock signals in a normal mode.

2. The clock recovery circuit of claim 1, wherein the at least two selection reference clock signals comprise a first selection reference clock signal and a second selection reference clock signal, rising edges of which are predicted to be aligned with a rising edge of the test data signal and a falling edge of the test data signal, respectively, as a result of the coarse phase fixing operation.

3. The clock recovery circuit of claim 1, wherein a number of the at least two selection reference clock signals varies in accordance with a kind of a pattern of the test data signal.

4. The clock recovery circuit of claim 1, wherein a phase difference between the at least two selection reference clock signals varies in accordance with a kind of a pattern of the test data signal.

5. The clock recovery circuit of claim 1, wherein
    the at least two selection reference clock signals comprise a first selection reference clock signal and a second selection reference clock signal, and
    the second PLL circuit is configured to generate a first sample signal by sampling the test data signal by the first selection reference clock signal, generate a second sample signal by sampling the test data signal by the second selection reference clock signal, and control phases of the second reference clock signals by complimentarily using the first sample signal and the second sample signal.

6. The clock recovery circuit of claim 5, wherein the second PLL circuit is configured to,
    generate the first sample signal having a first level by sampling the test data signal at a rising edge of the first selection reference clock signal at a periodic first point in time, and
    control phases of the second reference clock signals by using the first sample signal having the first level at a point in time of transition of a level of the second sample signal subsequent to the periodic first point in time.

7. The clock recovery circuit of claim 6, wherein a period of the periodic first point in time corresponds to a period of a rising edge of the test data signal.

8. The clock recovery circuit of claim 6, wherein the second PLL circuit is configured to,
    generate the second sample signal having a second level by sampling the test data signal at a rising edge of the second selection reference clock signal at a periodic second point in time, and
    control the phases of the second reference clock signals by using the second sample signal having the second level at a point in time of transition of a level of the first sample signal subsequent to the periodic second point in time.

9. The clock recovery circuit of claim 6, wherein a period of the periodic second point in time corresponds to a period of a falling edge of the test data signal.

10. A clock data recovery circuit, comprising:
    a clock recovery circuit configured to generate a recovery clock signal from an input data signal, the input data signal including an embedded clock signal; and
    a data recovery circuit configured to generate a recovery data signal from the input data signal by using the recovery clock signal,
    wherein the clock recovery circuit comprises a phase-locked loop (PLL) circuit, and
    the PLL circuit is configured to perform,
        a first phase fixing operation on a test data signal by using a first reference clock signal, the test data signal having a prescribed pattern,
        a second phase fixing operation on the test data signal by selectively using at least two selection reference clock signals, among a plurality of reference clock signals that are sequentially delayed from the first reference clock signal by a unit phase, having a phase difference of N times the unit phase, wherein N is an integer equal to or greater than 2, in a training mode, and a third phase fixing operation on the input data signal by using the plurality of reference clock signals in a normal mode.

11. The clock data recovery circuit of claim 10, wherein the PLL circuit comprises:

a sampling circuit configured to generate a plurality of sample signals by sampling the input data signal based on the plurality of reference clock signals; and a first phase detection circuit configured to detect an edge of the input data signal by using selected sample signals, among the plurality of sample signals, corresponding to the selection reference clock signals, in the training mode.

12. The clock data recovery circuit of claim 11, wherein the PLL circuit further comprises a second phase detection circuit configured to detect an edge of the input data signal by using the plurality of sample signals in the normal mode.

13. The clock data recovery circuit of claim 12, wherein an edge detecting range of a first phase detection circuit is greater than that of the second phase detection circuit.

14. The clock data recovery circuit of claim 12, wherein the PLL circuit further comprises a multiplexer configured to selectively output one of an output of a first phase detection circuit and an output of the second phase detection circuit based on a mode signal.

15. The clock data recovery circuit of claim 11, wherein the selected sample signals corresponding to the selection reference clock signals comprise a first sample signal and a second sample signal, and the first phase detection circuit comprises, a first training edge detector configured to output the first sample signal as a result of detecting a rising edge of the input data signal at a point in time of transition of a level of the second sample signal, a second training edge detector configured to output the second sample signal as a result of detecting a falling edge of the input data signal at a point in time of transition of a level of the first sample signal, and a phase control signal generator configured to generate a phase control signal on the plurality of reference clock signals based on the result of detecting the rising edge and the result of detecting the falling edge.

16. The clock data recovery circuit of claim 10, wherein the clock recovery circuit further comprises an auxiliary PLL circuit configured to perform a fourth phase fixing operation on the input data signal in advance of the first and third phase fixing operations of the PLL circuit, by using one of the plurality of reference clock signals in the training mode.

17. The clock data recovery circuit of claim 16, wherein the selection reference clock signals comprise at least one selection reference clock signal predicted to be synchronized to be close to a rising edge of the input data signal and at least one selection reference clock signal predicted to be synchronized to be close to a falling edge of the input data signal as a result of the third phase fixing operation of the auxiliary PLL circuit.

18. A clock recovery circuit comprising:

a first phase-locked loop (PLL) circuit configured to perform a coarse phase fixing operation on a test data signal having a prescribed pattern by using a first reference clock signal; and a second PLL circuit configured to perform a fine phase fixing operation on the test data signal subsequently to the coarse phase fixing operation, wherein the second PLL circuit is configured to generate, sample signals by using at least two selection reference clock signals, among a plurality of second reference clock signals, predicted that rising edges thereof are synchronized to be close to a rising edge or a falling edge of the test data signal as a result of the coarse phase fixing operation among the plurality of second reference clock signals in a training mode, the plurality of second reference clock signals sequentially delayed from the first reference clock signal by a unit phase, respectively, and a phase control signal for controlling phases of the second reference clock signals by complimentarily using the sample signals, and wherein the clock recovery circuit is configured to inactivate the first PLL circuit and cause the second PLL circuit to perform a fine phase fixing operation on a normal data signal by using the plurality of second reference clock signals in a normal mode.

19. The clock recovery circuit of claim 18, wherein the sample signals comprise a first sample signal and a second sample signal generated by different selection reference clock signals, respectively, and the second PLL circuit is configured to use a level of the first sample signal at a point in time of transition of a prescribed level of the second sample signal as a rising edge detecting result of the test data signal and a level of the second sample signal at a point in time of transition of a prescribed level of the first sample signal as a falling edge detecting result of the test data signal.

* * * * *